United States Patent
Baek et al.

(10) Patent No.: US 11,139,021 B2
(45) Date of Patent: Oct. 5, 2021

(54) PAGE BUFFER AND MEMORY DEVICE INCLUDING THE SAME

(71) Applicant: SAMSUNG ELECTRONICS CO., LTD., Suwon-si (KR)

(72) Inventors: Seheon Baek, Seoul (KR); Youngsun Min, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/809,016

(22) Filed: Mar. 4, 2020

(65) Prior Publication Data

US 2021/0050049 A1    Feb. 18, 2021

(30) Foreign Application Priority Data

Aug. 16, 2019    (KR) ........................ 10-2019-0100383

(51) Int. Cl.
| | |
|---|---|
| *G11C 7/00* | (2006.01) |
| *G11C 11/4091* | (2006.01) |
| *G11C 11/4094* | (2006.01) |
| *G11C 11/4093* | (2006.01) |
| *G11C 5/02* | (2006.01) |
| *G11C 7/22* | (2006.01) |

(Continued)

(52) U.S. Cl.
CPC .......... *G11C 11/4091* (2013.01); *G11C 5/025* (2013.01); *G11C 7/106* (2013.01); *G11C 7/1087* (2013.01); *G11C 7/222* (2013.01); *G11C 11/4074* (2013.01); *G11C 11/4093* (2013.01); *G11C 11/4094* (2013.01)

(58) Field of Classification Search
CPC ..... G11C 11/4091; G11C 5/025; G11C 7/106; G11C 7/1087; G11C 7/222; G11C 11/4074; G11C 11/4093; G11C 11/4094

USPC ......................................................... 365/203
See application file for complete search history.

(56) References Cited

U.S. PATENT DOCUMENTS

| | | | |
|---|---|---|---|
| 6,058,044 A | | 5/2000 | Sugiura et al. |
| 6,704,239 B2 * | | 3/2004 | Cho .................... G11C 7/1051 |
| | | | 365/185.12 |

(Continued)

FOREIGN PATENT DOCUMENTS

| | | |
|---|---|---|
| JP | 2000132985 | 5/2000 |
| KR | 10-0849715 | 7/2008 |

OTHER PUBLICATIONS

Ryuji Yamashita, et al., "A 512Gb 3b/Cell Flash Memory on 64-Word-Line-Layer BiCS Technology", 2017 IEEE International Solid-State Circuits Conference, Session 11, Nonvolatile Memory Solutions, 11.1, pp. 196-197.

*Primary Examiner* — Viet Q Nguyen
(74) *Attorney, Agent, or Firm* — F. Chau & Associates, LLC

(57) ABSTRACT

A memory device includes a first page buffer supplying a first bias voltage to a selected bitline in a bitline precharge phase; and a second page buffer supplying a second bias voltage to an unselected bitline, adjacent to the selected bitline, in the bitline precharge phase, wherein the first page buffer includes a first bitline precharge circuit supplying the first bias voltage to the selected bitline, the second page buffer includes a second bitline precharge circuit supplying the second bias voltage to the unselected bitline, wherein the second page buffer floats the unselected bitline in a sensing phase for detecting data of a selected memory cell connected to the selected to bitline.

20 Claims, 19 Drawing Sheets

(51) Int. Cl.
*G11C 7/10* (2006.01)
*G11C 11/4074* (2006.01)

(56) References Cited

U.S. PATENT DOCUMENTS

| | | | |
|---|---|---|---|
| 7,421,557 B2 * | 9/2008 | Lee | G11C 7/1039 |
| | | | 711/167 |
| 7,609,571 B2 | 10/2009 | Kim | |
| 7,672,166 B2 * | 3/2010 | Park | G11C 16/3418 |
| | | | 365/185.19 |
| 8,154,944 B2 | 4/2012 | Takahashi | |
| 9,202,581 B1 | 12/2015 | Kamei | |
| 10,204,686 B2 | 2/2019 | Lee et al. | |
| 2009/0067245 A1 * | 3/2009 | Isobe | G11C 16/10 |
| | | | 365/185.12 |
| 2009/0091981 A1 * | 4/2009 | Park | G11C 16/3418 |
| | | | 365/185.12 |
| 2012/0081961 A1 * | 4/2012 | Yoon | G11C 16/3459 |
| | | | 365/185.12 |
| 2018/0144800 A1 * | 5/2018 | Park | G11C 16/08 |

\* cited by examiner

PAGE BUFFER AND MEMORY DEVICE INCLUDING THE SAME

CROSS-REFERENCE TO RELATED APPLICATION

This application claims priority under 35 U.S.C. § 119 to Korean Patent Application No. 10-2019-0100383, filed on Aug. 16, 2019 in the Korean Intellectual Property Office, the disclosure of which is incorporated by reference herein in its entirety.

TECHNICAL FIELD

The present disclosure relates to memory devices, and more particularly to a memory device including a page buffer.

DISCUSSION OF RELATED ART

As demand increases for memory having smaller sizes and higher capacities, research is ongoing into memory devices having vertically stacked memory cells. Recently, chip size has been reduced in a memory device having a cell over periphery (COP) structure. In this case, when power noise occurs, internal operation may be affected.

SUMMARY

Exemplary embodiments of the present disclosure provide a memory device having vertically stacked memory cells that is resistant to noise by reducing an effective capacitance value of a selected bitline.

According to an exemplary embodiment, a memory device includes a first page buffer supplying a first bias voltage to a selected bitline in a bitline precharge phase; and a second page buffer supplying a second bias voltage to an unselected bitline, adjacent to the selected bitline, in the bitline precharge phase, wherein the first page buffer includes a first bitline precharge circuit supplying the first bias voltage to the selected bitline, the second page buffer includes a second bitline precharge circuit supplying the second bias voltage to the unselected bitline, wherein the second page buffer floats the unselected bitline in a sensing phase for detecting data of a selected memory cell connected to the selected bitline.

According to an exemplary embodiment, a page buffer supplying a bitline voltage to a bitline connected to a plurality of memory cells is provided, the page buffer comprising: a data latch storing information on whether a selected memory cell is provided among the plurality of memory cells; and a bitline precharge circuit, controlled by the data latch, and having a first bitline precharge control element connected between the bitline and a first power node outputting a first bitline voltage, a second bitline precharge control element connected to a second power node outputting a second bitline voltage lower than the first bitline voltage, and a first bitline voltage control element connected between the first bitline precharge control element and the second bitline precharge control element, wherein the first bitline voltage control element is turned-off during a sensing node development phase when the bitline is an unselected bitline.

According to an exemplary embodiment, a memory device includes a memory controller providing a first phase for bitline precharge, a second phase for sensing node precharge following the bitline precharge, and a third phase for sensing node development following the sensing node precharge; a plurality of memory cells arranged in a stacked three-dimensional matrix of adjacent strings; and at least one page buffer connected to the memory controller and the plurality of memory cells, the at least one page buffer including first and second non-grounded bitline bias voltage outputs concurrently connectable to adjacent strings, the at least one page buffer comprising a first page buffer bitline precharge circuit connected to a selected bitline with a first bias voltage during the first phase, and a second page buffer bitline precharge circuit connected to an unselected bitline, adjacent to the selected bitline, with a second bias voltage lower than the first bias voltage during the first phase, wherein, during the second phase after the first phase, the first page buffer bitline precharge circuit precharges a sensing node connected to the selected bitline with a third bias voltage higher than the first bias voltage, wherein during the third phase, the second page buffer bitline precharge circuit floats the unselected bitline while detecting data of a selected memory cell connected to the selected bitline, wherein the first page buffer bitline precharge circuit includes a bitline current control element controlling a current flowing into the selected bitline such that the selected bitline is precharged with the first bias voltage, wherein the memory device compares a control signal for controlling the bitline current control element with a reference signal during the third phase, and floats the unselected bitline during a phase in which the control signal is greater than the reference signal.

BRIEF DESCRIPTION OF THE DRAWINGS

The above and other aspects, features and advantages of the present disclosure will be more clearly understood from the following detailed description, taken in conjunction with the accompanying drawings, in which.

DETAILED DESCRIPTION

Hereinafter, exemplary embodiments of the present disclosure will be described in detail with reference to the attached drawings.

Figure 1:
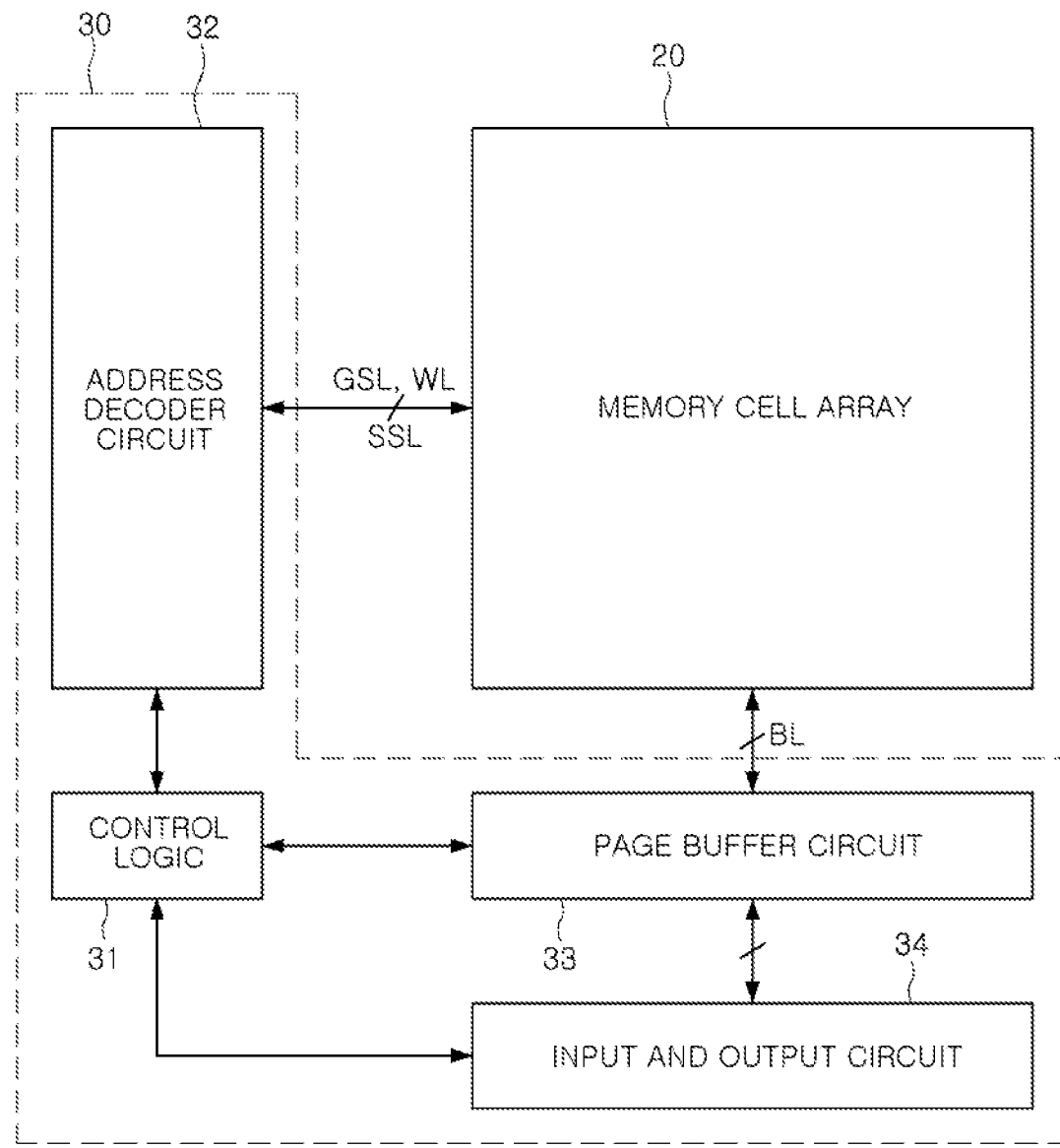
FIG. 1 is a schematic block diagram illustrating a memory device according to an exemplary embodiment of the present disclosure.

FIG. 1 is a schematic block diagram illustrating a memory device according to an exemplary embodiment of the present disclosure.

First, referring to FIG. 1, a memory device 10 according to an exemplary embodiment may include a memory cell array 20 and a memory controller 30 connected to the memory cell array. The memory cell array 20 may include a plurality of memory cells, and at least some of the plurality of memory cells may be connected to each other to provide a memory cell string. The memory cell array 20 may include a plurality of memory cell strings, and the plurality of memory cell strings may be divided into a plurality of blocks. The memory controller 30 may include control logic 31, an address decoder circuit 32 connected to the control logic and to the memory cell array, a page buffer circuit 33 connected to the control logic and to the memory cell array, an input and output circuit 34 connected to the control logic and to the page buffer circuit, and the like.

In an exemplary embodiment, the address decoder circuit 32 may be connected to memory cells MC through a wordline WL, a string select line SSL, a ground select line GSL, or the like, while the page buffer circuit 33 may be connected to the memory cells MC(1,1,1) through MC(l,m,n) through bitlines BL(1) through BL(m), respectively. In an exemplary embodiment, the address decoder circuit 32 may select a memory cell MC on which data is to be written or from which data is to be read, and may receive address information for selecting the memory cell MC from the control logic 31.

The page buffer circuit 33 may write data on the memory cell MC, or may read data from the memory cell MC, and may write or read data in units of pages. The page buffer circuit 33 may include a plurality of page buffers, and each of the plurality of page buffers may be connected to at least one bitline BL. Data which is to be written by the page buffer circuit 33 on the memory cell array 20, or data which the page buffer circuit 33 reads from the memory cell array 20 may be input and output through the input and output circuit 34. Meanwhile, operations of the address decoder circuit 32, the page buffer circuit 33, and the input and output circuit 34 may be controlled by the control logic 31.

According to a contrasting example, a voltage of a selected bitline might be changed by noise. As the voltage of the selected bitline is changed, data of the selected memory cell might be read incorrectly.

The page buffer circuit 33 according to an exemplary embodiment of the present disclosure may reduce the time required for the bitline voltage changed by the influence of noise to recover to its original state. Thus, a memory device 10 may accurately read a state of a selected memory cell even if noise is present.

Figure 2:
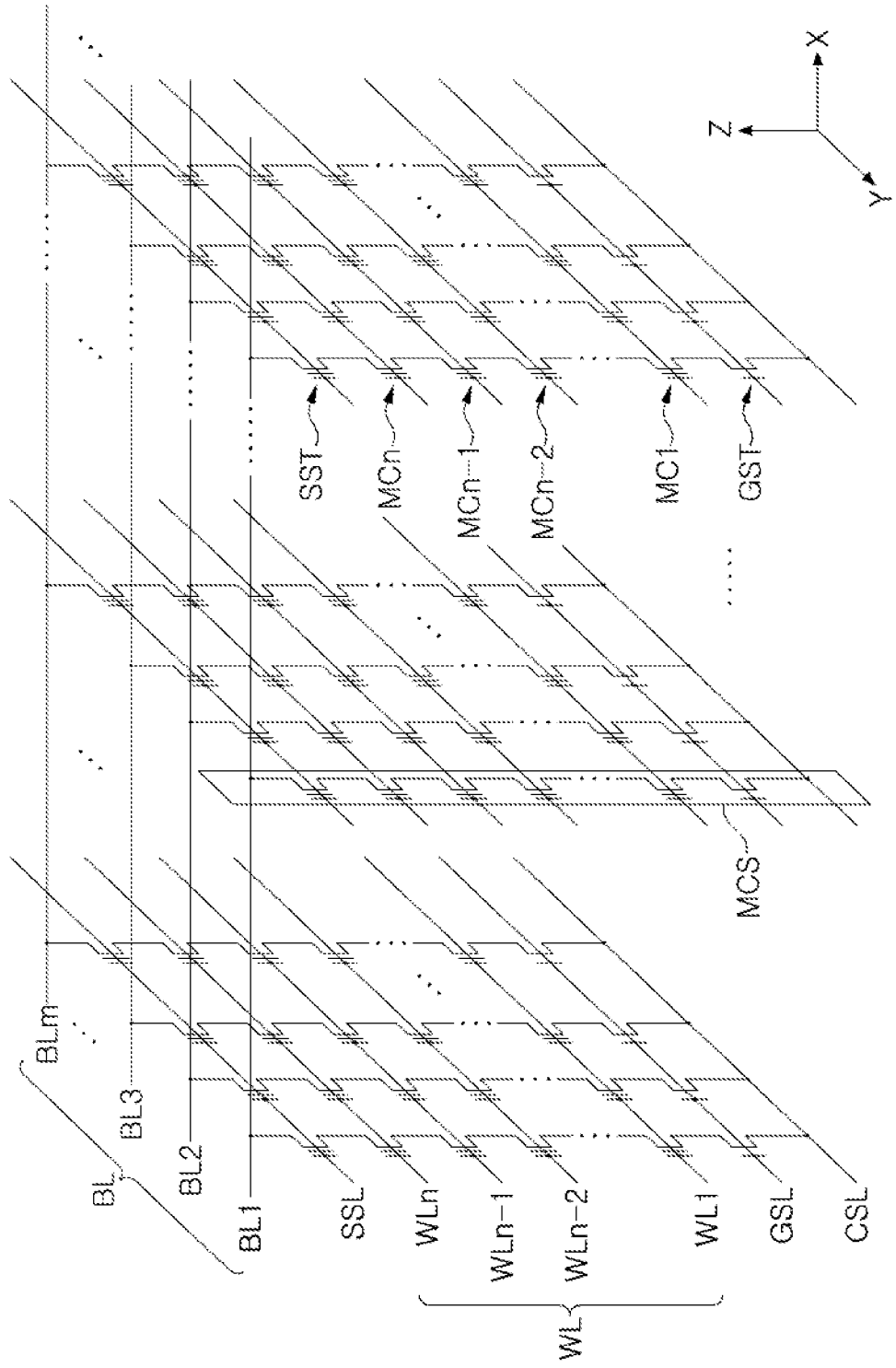
FIG. 2 is a schematic three-dimensional diagram illustrating a memory cell array included in a memory device according to an exemplary embodiment of the present disclosure.

FIG. 2 is a schematic three-dimensional diagram illustrating a memory cell array included in a memory device according to an exemplary embodiment of the present disclosure. Referring to FIG. 2, a memory cell array according to an exemplary embodiment of the present disclosure may include a plurality of memory cells MC. The memory cells MC are connected to a plurality n of wordlines WL (arranged along the Z axis and extending along the Y axis), and a plurality m of bitlines BL (arranged along the Y axis and extending along the X axis) to be operated in a plurality l of layers (arranged along the X axis and extending in the Y-Z plane). As an example, each of the memory cells MC may be connected to a single wordline WL and a single bitline BL.

The plurality of memory cells MC may be connected to each other in series to provide a single memory cell string MCS. The memory cell string MCS may further include a string select transistor SST and a ground select transistor GST in addition to the memory cells MC. The string select transistor SST may be connected to any one of bitlines BL in an upper portion of the memory cells MC in the memory cell string MCS. The ground select transistor GST may be connected to a common source line CSL in a lower portion of the memory cells MC.

In an exemplary embodiment illustrated in FIG. 2, it is illustrated that a single memory cell string MCS includes one ground select transistor GST and one string select transistor SST, but the number of ground select transistors GST and string select transistors SST may vary. Moreover, between the ground select transistor GST and the wordlines WL, and between the string select transistor SST and the wordlines WL, a dummy wordline may be further provided.

In a contrasting example, the first bitline BL1 may be a selected bitline, while the second bitline BL2 may be an unselected bitline. In a selective precharge operation, the first bitline BL1 may be precharged with a voltage lower than a power supply voltage VDD and higher than a ground voltage GND. The second bitline BL2 may be precharged with a ground voltage GND. Thus, an effective capacitance value of the selected bitline BL1 may be increased. When the effective capacitance value of the selected bitline BL1 is increased, a large amount of time may be required for a voltage of the bitline, changed by influence of external noise, to recover to its original state.

A memory device according to an exemplary embodiment of the present disclosure may reduce an effective capacitance value of a selected bitline BL1. Thus, the time required for the bitline voltage changed by the influence of noise to recover to its original state may be reduced. Thus, a memory device may accurately read a state of a selected memory cell.

Figure 3:
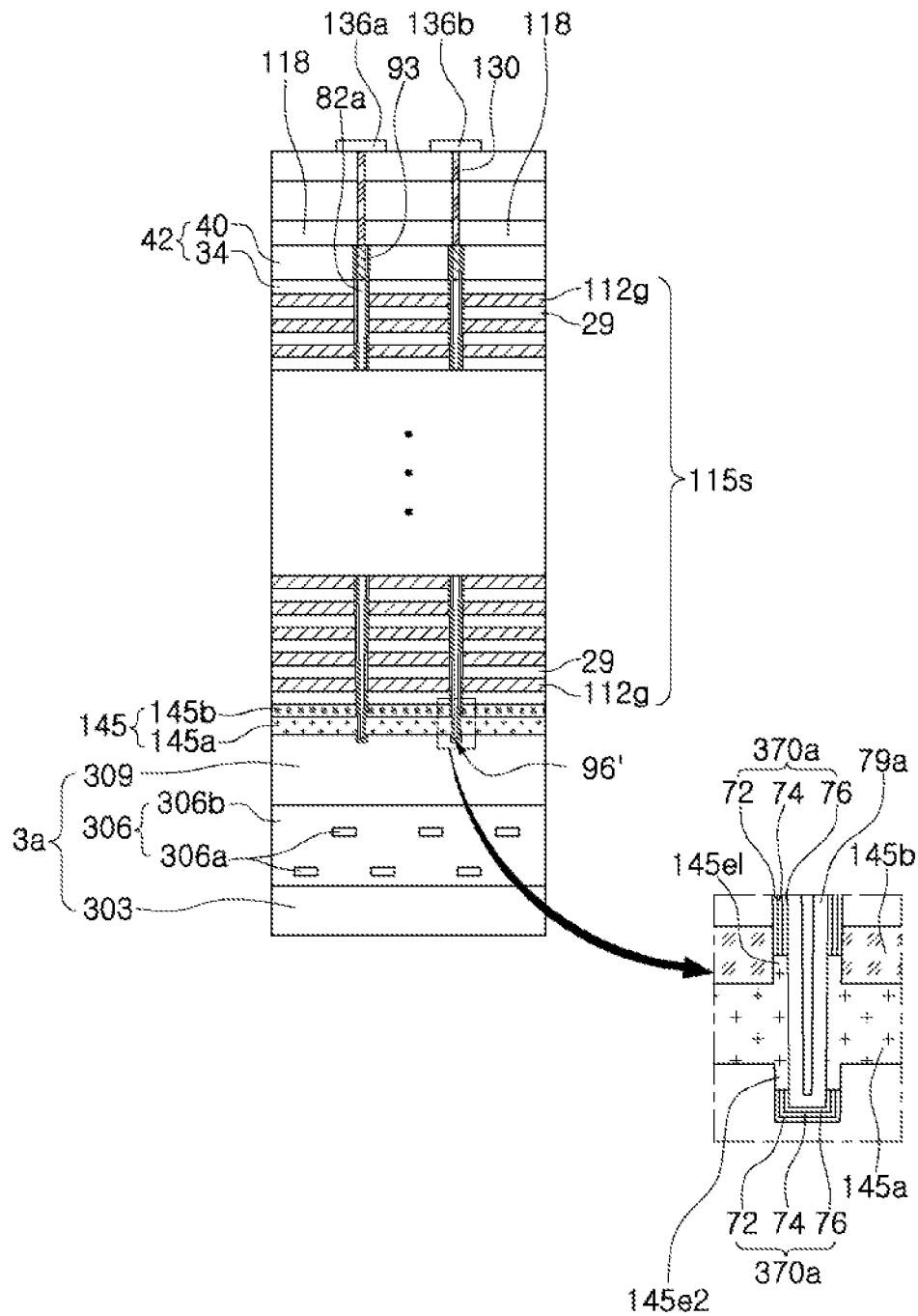
FIG. 3 is a schematic diagram illustrating a structure of a memory device according to an exemplary embodiment of the present disclosure.

FIG. 3 is a schematic diagram illustrating a structure of a memory device according to an exemplary embodiment of the present disclosure.

Referring to FIG. 3, a memory device according to an exemplary embodiment of the present disclosure may include a substrate 3a, a multilayer structure 115s, a capping structure 42, and a plurality of vertical structures 96'. The substrate 3a may be a semiconductor substrate. The multilayer structure 115s may be disposed on the substrate 3a.

The multilayer structure 115s is disposed in a memory cell array region of the substrate 3a and may be extended into an extended region of the substrate 3a adjacent to a memory cell array region. The multilayer structure 115s may include interlayer insulating layers and gate layers, alternately and repeatedly stacked. For example, the multilayer structure 115s may include interlayer insulating layers 29 and gate layers 112g, alternately and repeatedly stacked. The gate layers 112g may be substantially parallel to an upper surface of the substrate 3a, for example.

The gate layers 112g may include upper gate layers, intermediate gate layers, and lower gate layers. The upper gate layers may correspond to top two gate layers, among the gate layers 112g. At least one among the upper gate layers may provide a string select line SSL.

The lower gate layers may correspond to bottom two gate layers, among the gate layers 112g. At least one among the lower gate layers may provide a ground select line GSL.

Gate layers between the upper gate layers and the lower gate layers may correspond to intermediate gate layers. The intermediate gate layers may each provide a wordline WL.

The capping structure 42 may include a first lower capping layer 34 and a first upper capping layer 40 on the first lower capping layer 34. The first upper capping layer 40 may be thicker than the first lower capping layer 34.

The substrate 3a may include a lower substrate 303, an upper substrate 309 on the lower substrate 303, and a peripheral circuit region 306 between the lower substrate 303 and the upper substrate 309. The lower substrate 303 may be a semiconductor substrate. The upper substrate 309 may include a semiconductor material and/or a conductive material. The peripheral circuit region 306 may include peripheral circuit patterns 306a and a peripheral insulating layer 306b covering the peripheral circuit patterns 306a.

The memory device may further include a horizontal connection pattern 145 and the vertical structures 96'. A horizontal connection pattern 145 may be disposed between the multilayer structure 115s and the substrate 3a. For example, the horizontal connection pattern 145 may be disposed between a lowermost first interlayer insulating layer, among the interlayer insulating layers 29, and the substrate 3a.

The first vertical structures 96' may pass through the capping structure 42, the multilayer structure 115s, and the horizontal connection pattern 145, and may be extended into the substrate 3a.

The first vertical structure may include a first core pattern 82a and a pad pattern 93 on an upper surface of the first core pattern 82a. The first core pattern 82a may include an insulating material. The first core pattern 82a may be formed of silicon oxide.

The first vertical structure 96' may include a first dielectric structure 370a covering a lower surface of the first semiconductor layer 79a while covering an outer side surface of the first semiconductor layer 79a. For example, the first dielectric structure 370a may include a first dielectric layer 72, a second dielectric layer 76, and an information storage layer 74 between the first dielectric layer 72 and the second dielectric layer 76.

The horizontal connection pattern 145 may include a first horizontal connection pattern 145a and a second horizontal connection pattern 145b on the first horizontal connection pattern 145a. The first horizontal connection pattern 145a and the second horizontal connection pattern 145b may be formed of silicon. The first horizontal connection pattern 145a and the second horizontal connection pattern 145b may be formed of doped polysilicon or the like. For example, the first horizontal connection pattern 145a and the second horizontal connection pattern 145b may be formed of polysilicon with N-type conductivity. In another example, at least one of the first horizontal connection pattern 145a and the second horizontal connection pattern 145b may include a metal (e.g., W, or the like) or a metal nitride (e.g., WN, TiN, or the like). The horizontal connection pattern 145 may be in contact with the substrate 3a.

In a region adjacent to the first vertical structure 96a', the first horizontal connection pattern 145a may be in contact with the first semiconductor layer 79a, while the second horizontal connection pattern 145b may be spaced apart from the first semiconductor layer 79a.

The first horizontal connection pattern 145a may include an extended portion 145e1 from a portion in contact with the first semiconductor layer 79a to a gap between the second horizontal connection pattern 145b and the first semiconductor layer 79a, and an extended portion 145e2 from a portion in contact with the first semiconductor layer 79a to a gap between the substrate 3a and the first semiconductor layer 79a. Each of the extended portions 145e1 and 145e2 of the first horizontal connection pattern 145a may have a length less than a thickness of the second horizontal connection pattern 145b.

A memory device according to an exemplary embodiment of the present disclosure may further include bitline contact plugs 130, a first bitline 136a, and a second bitline 136b. The bitline contact plugs 130 may be electrically connected to the pad patterns 93 of the first vertical structure 96a. The first bitline 136a and the second bitline 136b may be disposed on the bitline contact plugs 130.

According to a contrasting example, a memory device having a cell over periphery (COP) structure similar to that illustrated in FIG. 3 may have increased bitline capacitance. In this case, when power noise occurs, an internal operation of a memory device may be significantly affected.

In FIG. 3, the first bitline 136a is a selected bitline, while the second bitline 136b may be an unselected bitline. In a selective precharge operation, the first bitline 136a may be precharged with a voltage lower than a power supply voltage VDD and higher than a ground voltage GND. The second bitline 136b may be precharged with a ground voltage GND. Thus, an effective capacitance value of the selected bitline may be increased. When the effective capacitance value of the selected bitline is increased, a large amount of time may be required for a voltage of the bitline, changed by influence of external noise, to recover to its original state.

A memory device according to an exemplary embodiment of the present disclosure may float a second bitline 136b during a sensing node development phase for detecting data of a memory cell. For example, the float may be accomplished by the second page buffer floating the unselected second bitline while the first page buffer senses the selected first bitline. Thus, an effective capacitance value of the selected bitline may be reduced. When the effective capacitance value of the selected bitline is reduced, the time may be reduced for the bitline voltage, such as when changed by influence of noise, to recover to its original state.

Figure 4:
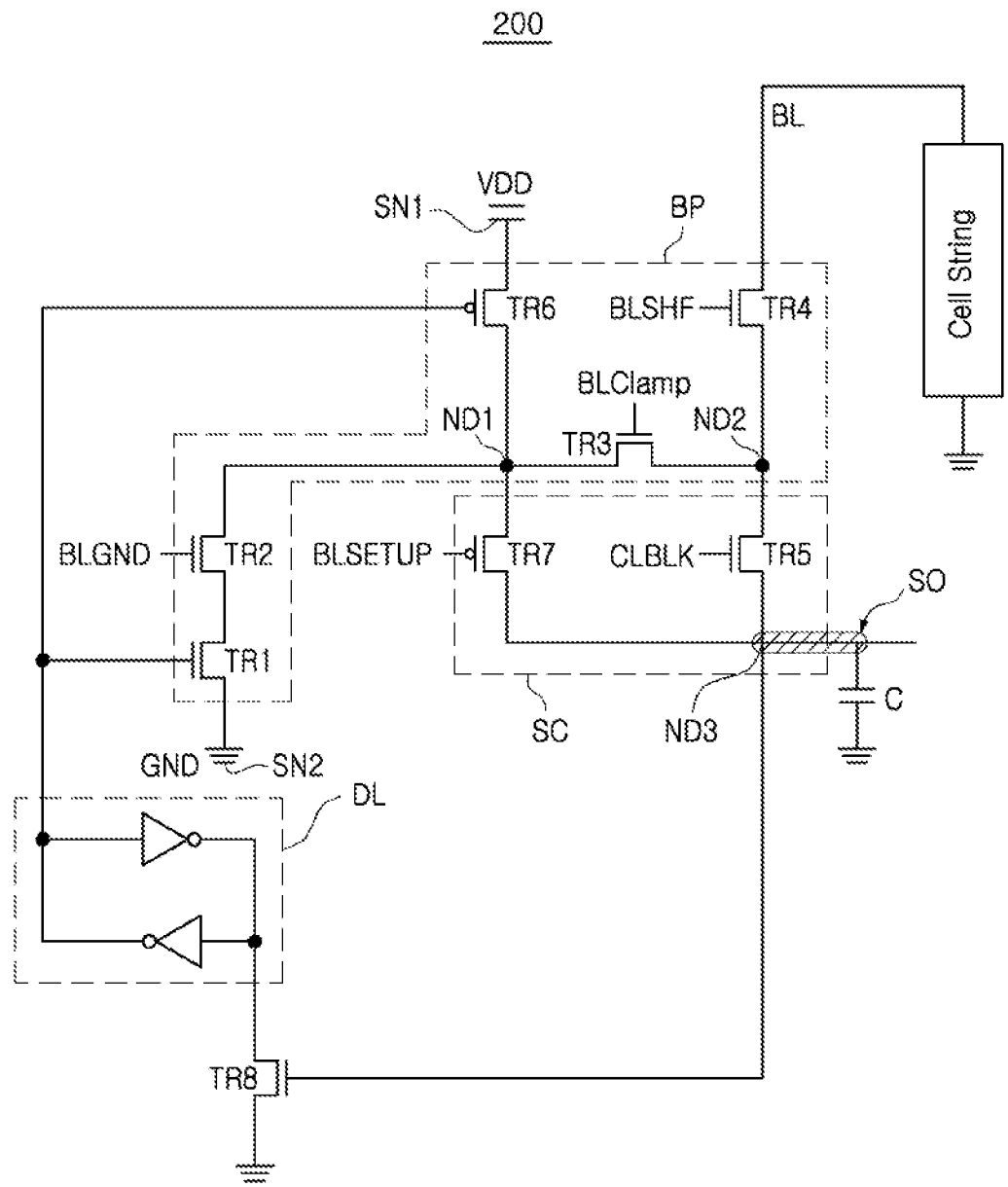
FIG. 4 is a circuit diagram illustrating a page buffer according to an exemplary embodiment of the present disclosure.

FIG. 4 is a circuit diagram illustrating a page buffer according to an exemplary embodiment of the present disclosure. Referring to FIG. 4, a page buffer 200 may include a first power node SN1, a second power node SN2, a data latch DL, a bitline precharge circuit BP, a sensing node SO, a capacitor C, and a sensing node control circuit SC.

The first power node SN1 may output a first bitline voltage to a bitline BL connected to the page buffer 200. For example, the first power node SN1 may supply a power supply voltage VDD. The second power node SN2 may output a second bitline voltage to a bitline BL connected to the page buffer 200. For example, the second power node SN2 may provide a ground voltage GND.

The data latch DL may store information on whether a selected memory cell is provided among a plurality of memory cells connected to the bitline BL. The data latch DL may control the bitline precharge circuit BP to input one of a first bitline voltage or a second bitline voltage to the bitline BL, according to information on whether a selected memory cell is provided.

The bitline precharge circuit BP may be connected to the bitline BL, and may precharge the bitline BL. The bitline precharge circuit BP may include at least a first transistor TR1 and a sixth transistor TR6. For example, the first transistor TR1 may be an NMOS transistor, while the sixth transistor TR6 may be a PMOS transistor. The first transistor TR1 and the sixth transistor TR6 may be connected between a first power node SN1 and a second power node SN2. The data latch DL may be commonly connected to a gate of the first transistor TR1 and a gate of the sixth transistor TR6.

The data latch DL may control the first transistor TR1 and the sixth transistor TR6 to input one of a first bitline voltage and a second bitline voltage to the bitline BL, according to information on whether a selected memory cell is provided.

For example, when a selected memory cell is provided among a plurality of memory cells connected to the bitline BL, the data latch DL may input a first bitline voltage to the bitline BL. When a selected memory cell is not provided among the plurality of memory cells, a data latch DL may input a second bitline voltage to the bitline BL. The first bitline voltage may be lower than a power supply voltage VDD and higher than a ground voltage GND. The second bitline voltage may be a ground voltage GND.

A second transistor TR2 may be connected between the first transistor TR1 and the sixth transistor TR6 within the bitline precharge circuit BP. A gate of the second transistor TR2 may receive a second bitline voltage control signal BLGND. The bitline precharge circuit BP may control the supply of a second bias voltage to the bitline BL based on the second bitline voltage control signal BLGND.

According to an exemplary embodiment, the bitline precharge circuit BP may further include a third transistor TR3 and a fourth transistor TR4. A first node ND1 may be connected between the second transistor TR2 and the sixth transistor TR6. The third transistor TR3 may be connected between the first node ND1 and the second node ND2. A gate of the third transistor TR3 may receive a first bitline voltage control signal BLClamp. The bitline precharge circuit BP may control the supply of a first bias voltage to the bitline BL based on the first bitline voltage control signal BLClamp.

For example, in a sensing node development phase, the third transistor TR3 may control a voltage of the second node ND2 to be lower than a voltage precharged in the sensing node SO, and a current may flow well between the sensing node SO and the bitline BL by the control of the third transistor TR3.

The fourth transistor TR4 may be connected between the bitline BL and the second node ND2. A gate of the fourth transistor TR4 may receive a bitline current control signal BLSHF. The fourth transistor TR4 may control a current flowing into a bitline BL such that the bitline BL is precharged with a voltage lower than a power supply voltage VDD and higher than a ground voltage GND, based on the bitline current control signal BLSHF.

The sensing node control circuit SC may be connected to the sensing node SO, and may precharge the sensing node SO. Moreover, the sensing node control circuit SC controls the sensing node SO to be connected to the bitline BL, so the sensing node SO may be used for detecting data of a memory cell. The capacitor C may be connected between the sensing node SO and a ground voltage supply.

The sensing node control circuit SC may include a fifth transistor TR5 and a seventh transistor TR7. For example, the fifth transistor TR5 may be an NMOS transistor, while the seventh transistor TR7 may be a PMOS transistor. The seventh transistor TR7 may be connected between the first node ND1 and the third node ND3. The fifth transistor TR5 may be connected between the second node ND2 and the third node ND3.

A gate of the seventh transistor TR7 may receive a sensing node precharge control signal BLSETUP. The seventh transistor TR7 may control a sensing node SO connected to the third node ND3 to be precharged with a power supply voltage VDD based on the sensing node precharge control signal BLSETUP.

A gate of the fifth transistor TR5 may receive a sensing control signal CLBLK. When the sensing node SO is developed, the fifth transistor TR5 may serve to connect the sensing node SO to the bitline BL based on a sensing control signal CLBLK.

The page buffer 200 may further include an eighth transistor TR8. A gate of the eighth transistor TR8 may be connected to the sensing node SO. The gate of the eighth transistor TR8 may receive a voltage of the sensing node SO, finally developed. The eighth transistor TR8 may determine a value to be stored in the data latch DL using the voltage of the sensing node SO, finally developed. The memory device may detect data stored in a memory cell using a value stored in the data latch DL.

The first transistor TR1 may be a second bitline precharge control element, while the second transistor TR2 may be a second bitline voltage control element. The third transistor TR3 may be a first bitline voltage control element, while the fourth transistor TR4 may be a bitline current control element. The fifth transistor TR5 may be a sensing control element, while the sixth transistor TR6 may be a first bitline precharge control element. The seventh transistor TR7 may be a sensing node precharge control element. According to an exemplary embodiment, the third transistor TR3 may be a second bitline voltage control element, while the second transistor TR2 may be a first bitline voltage control element.

In a contrasting example, as power noise occurs in a memory device, a corresponding noise may occur in a bitline current control signal BLSHF controlling an operation of the fourth transistor TR4. When the noise occurs in the bitline current control signal BLSHF, a voltage of the selected bitline may be also changed. In a selective precharge operation, an unselected bitline adjacent to a selected bitline is precharged with a ground voltage, so an effective capacitance value of the selected bitline may be increased. Thus, a large amount of time may be required for a bitline voltage, changed by influence of noise, to recover to its original state.

A memory device according to an exemplary embodiment of the present disclosure reduces the effective capacitance value of the selected bitline so the time may be reduced for the bitline voltage, changed by influence of noise, to recover to its original state.

Figure 5:
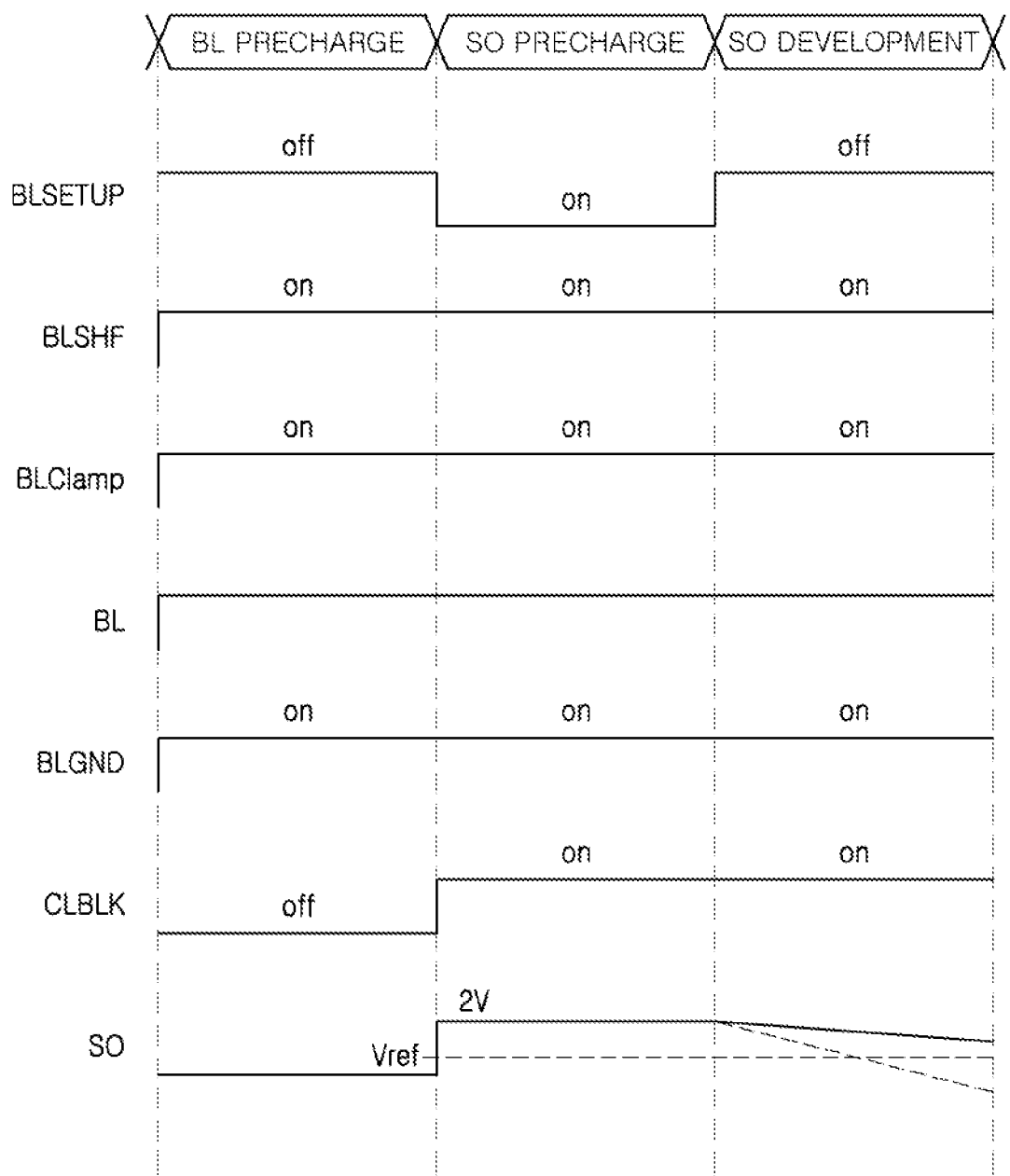
FIG. 5 is a voltage timing diagram according to an exemplary embodiment of the present disclosure.

FIG. 5 is a voltage timing diagram according to an exemplary embodiment of the present disclosure, and FIGS. 6 to 9 are views illustrating a method of operating a page buffer according to an exemplary embodiment of the present disclosure. A read operation according to an exemplary embodiment may include a bitline precharge phase, a sensing node precharge phase, and a sensing node development phase each as illustrated in FIG. 5.

Figure 6:
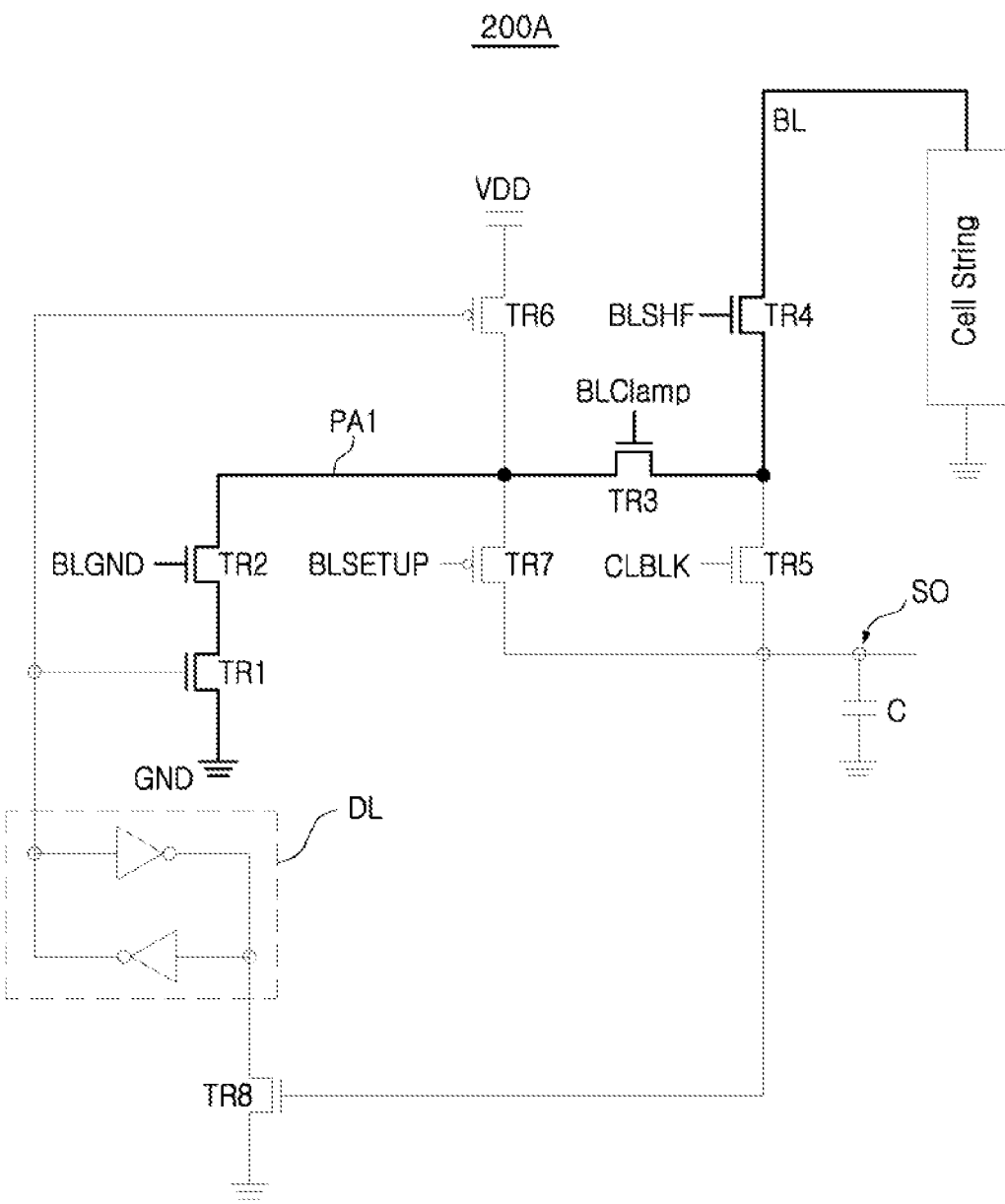
FIGS. 6 to 9 are highlighted circuit diagrams illustrating a method of operating a page buffer according to an exemplary embodiment of the present disclosure.

FIG. 6 is a highlighted circuit diagram illustrating a method of operating a page buffer for precharging an unselected bitline.

Referring to FIGS. 5 and 6 together, in a bitline precharge phase, a data latch DL controls the first transistor TR1 and the sixth transistor TR6 to input one of a first bitline voltage and a second bitline voltage to the bitline BL, according to information on whether a selected memory cell is provided.

As an example, when the bitline BL is an unselected bitline, '1' may be stored in the data latch DL. Thus, the first transistor TR1 is turned-on, while the sixth transistor TR6 is turned-off.

The second transistor TR2 may be operated in response to a second bitline voltage control signal BLGND. The third transistor TR3 may be operated in response to a first bitline voltage control signal BLClamp. The fourth transistor TR4 may be operated in response to a bitline current control signal BLSHF. The second transistor TR2, the third transistor TR3, and the fourth transistor TR4 may always be turned-on during the read operation.

The seventh transistor TR7 may be operated in response to a sensing node precharge control signal BLSETUP. The fifth transistor TR5 may be operated in response to a sensing control signal CLBLK. The seventh transistor TR7 and the fifth transistor TR5 may be turned-off during a bitline precharge phase. Thus, in a contrasting example, a page buffer 200A may form a first path PA1 for precharging an unselected bitline BL with a ground voltage GND.

Figure 7:
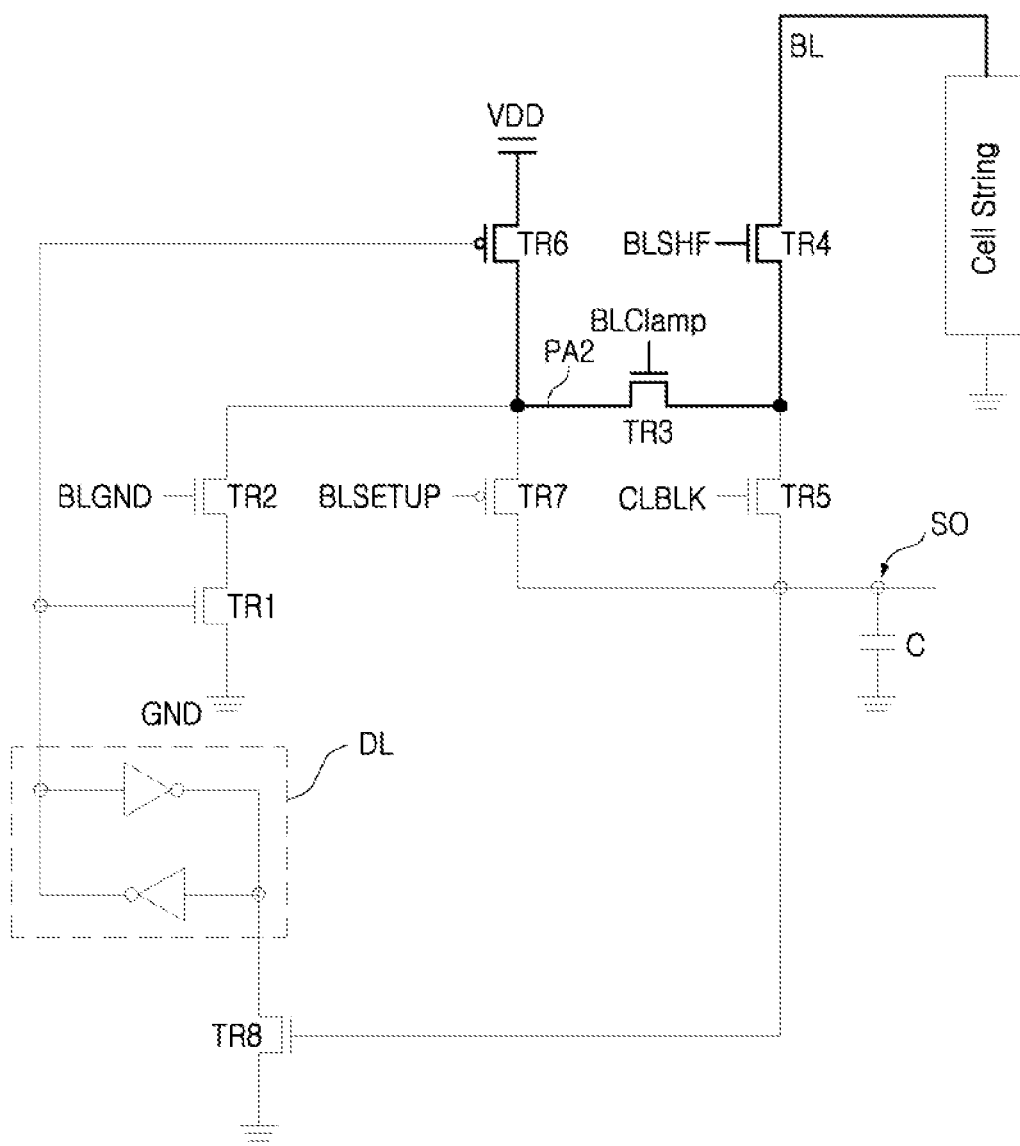

FIG. 7 is a highlighted circuit diagram illustrating a method of operating a page buffer for precharging a selected bitline according to an exemplary embodiment of the present disclosure.

Referring to FIGS. 5 and 7 together, in a bitline precharge phase, a data latch DL controls the first transistor TR1 and the sixth transistor TR6 to input one of a first bitline voltage and a second bitline voltage to the bitline BL, according to information on whether a selected memory cell is provided.

As an example, when the bitline BL is a selected bitline, '0' may be stored in the data latch DL. Thus, the first transistor TR1 is turned-off, while the sixth transistor TR6 is turned-on. The second transistor TR2, the third transistor TR3, and the fourth transistor TR4 may always be turned-on during the read operation. The seventh transistor TR7 and the fifth transistor TR5 may be turned-off during a bitline precharge phase. Thus, the page buffer 200B may form a second path PA2 for precharging a selected bitline BL with a voltage lower than a power supply voltage VDD and higher than a ground voltage GND.

The fourth transistor TR4 may control a current flowing into the bitline BL in response to a bitline current control signal BLSHF. Thus, the fourth transistor TR4 may control the selected bitline BL to be precharged with a voltage lower than a power supply voltage VDD and higher than a ground voltage GND.

The selected bitline BL is precharged, and then a current may flow in a memory cell connected to the selected bitline BL. The current flowing in the memory cell connected to the selected bitline BL may be changed depending on a state of the memory cell.

Figure 8:
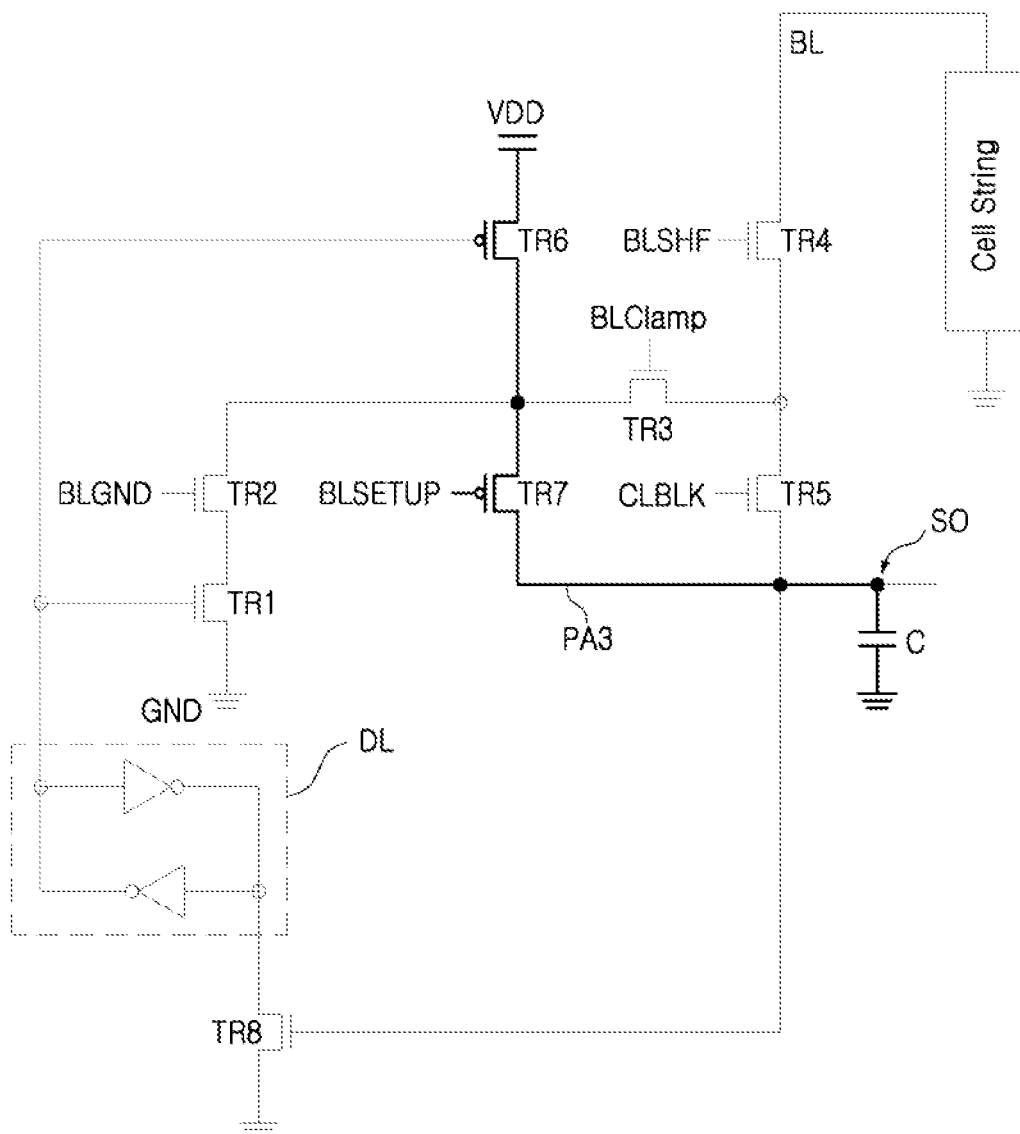

FIG. 8 is a highlighted circuit diagram illustrating a method of operating a page buffer for precharging a sensing node according to an exemplary embodiment of the present disclosure.

Referring to FIGS. 5 and 8 together, the sixth transistor TR6 may always maintain a turned-on state by a data latch DL in a sensing node precharge phase. The seventh transistor TR7 and the fifth transistor TR5 may be turned-on during a sensing node precharge phase. Thus, a page buffer 200C may form a third path PA3 for precharging a capacitor C connected to a sensing node SO with a power supply voltage VDD.

According to an exemplary embodiment, an unselected bitline may perform a data dump operation in a sensing node precharge phase. In this case, the sensing node SO may provide a path in which data moves between latches. When a data dump operation is performed, the second transistor TR2 may be turned-off in response to a second bitline voltage control signal BLGND. Thus, an electrical short of the sensing node SO may be prevented from occurring.

Figure 9:
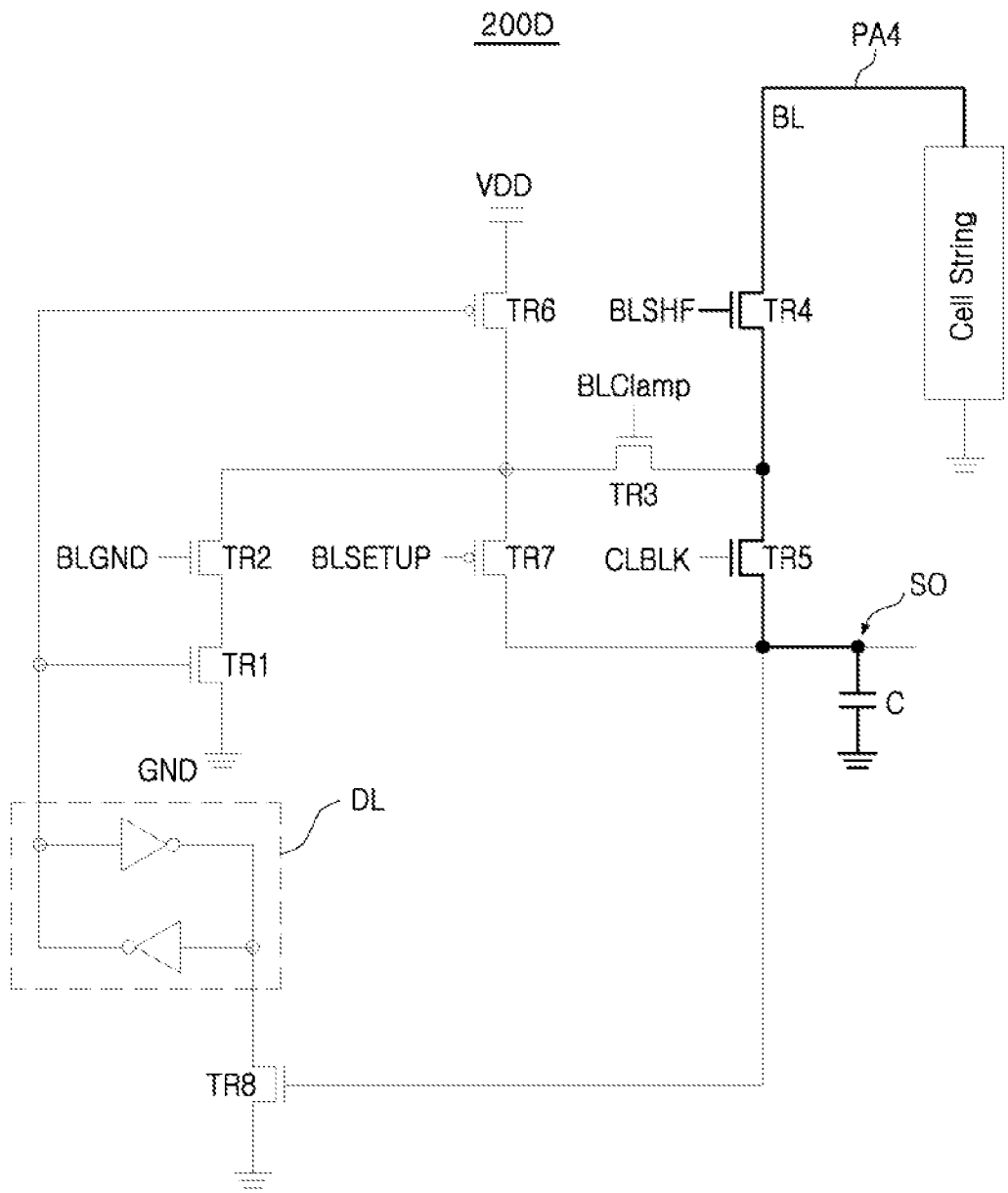

FIG. 9 is a highlighted circuit diagram illustrating a method of operating a page buffer for developing a sensing node according to an exemplary embodiment of the present disclosure.

Referring to FIGS. 5 and 9 together, in a sensing node development phase, the seventh transistor TR7 may be turned-off. The fifth transistor TR5 and the fourth transistor TR4 may be continuously turned on. Thus, the page buffer 200D may form a path in which the sensing node SO is developed.

When the bitline BL is precharged, according to a state of a memory cell connected to the bitline BL, a current flowing in the memory cell may be changed. Depending on the current flowing in the memory cell, a charge stored in the capacitor C may flow along the bitline BL. A degree in which the charge stored in the capacitor C flows along the bitline BL may be changed according to a current flowing in a memory cell.

At a specific point in time, the fifth transistor TR5 may be turned-off. The memory device may read a voltage of a sensing node SO to detect data stored in a memory cell. For example, a voltage of the sensing node SO, finally developed, may determine a value to be stored in a data latch DL. The memory device may detect data stored in a memory cell using a value stored in the data latch DL.

Figure 10:
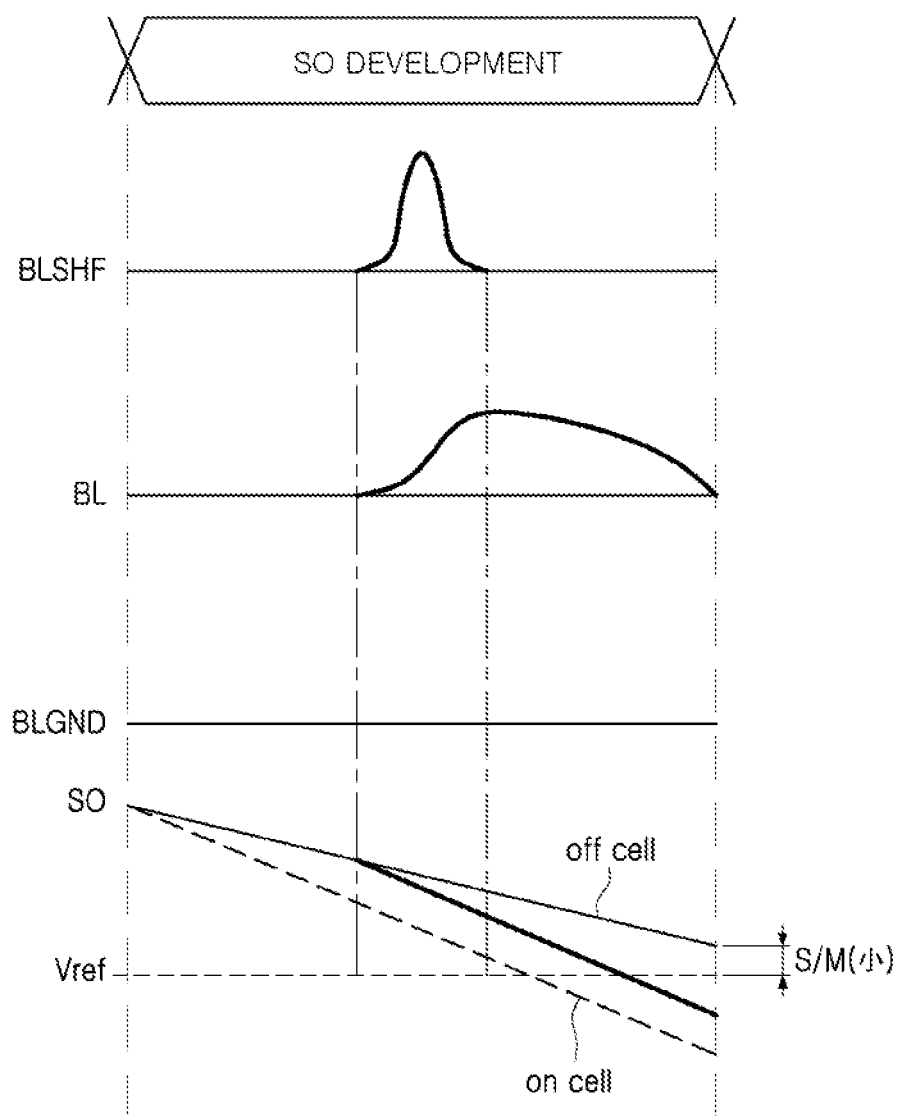
FIGS. 10 and 11 are voltage timing diagrams according to an exemplary embodiment of the present disclosure.
Figure 11:
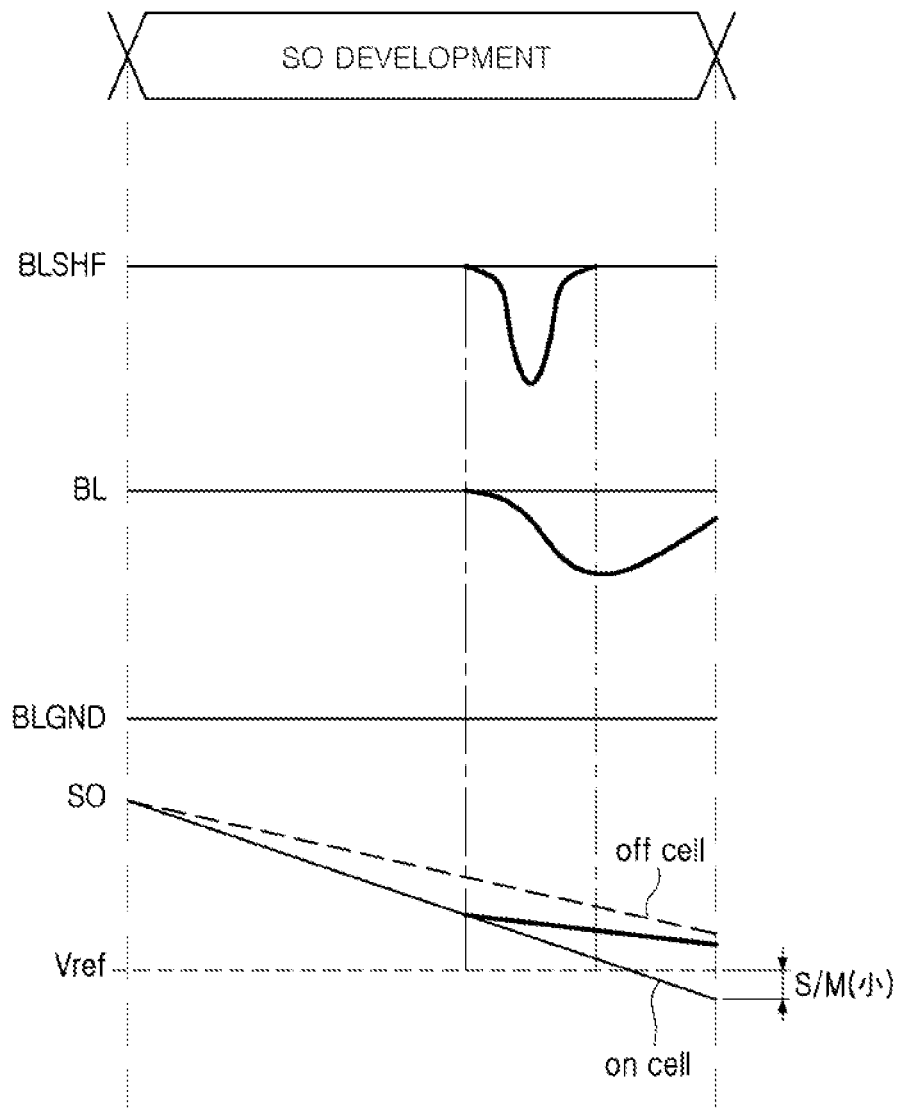

FIGS. 10 and 11 are voltage timing diagrams according to an exemplary embodiment of the present disclosure. When a power supply noise occurs inside or outside a chip, an internal operation of a memory device may be significantly affected. In a contrasting example, when a power supply noise occurs during a sensing node development phase, a memory device may be adversely affected.

Referring to FIG. 10, as a power supply noise occurs, a noise may occur in a bitline current control signal BLSHF controlling an operation of the fourth transistor TR4. The noise may have a magnitude greater than a magnitude of the bitline current control signal BLSHF. Thus, due to the influence of the noise occurring in the bitline current control signal BLSHF, a magnitude of a voltage of the bitline BL may be increased.

In a selective precharge operation, an unselected bitline, adjacent to a selected bitline is precharged with a ground voltage, so an effective capacitance value of the selected bitline may be increased. Thus, a large amount of time may be required for a bitline voltage, reduced by influence of noise, to recover to its original state.

In a sensing node development phase, depending on a current flowing in a memory cell, a voltage of the sensing node SO may be changed. The sensing node is to developed, and then data of a memory cell may be detected. When the memory cell is an off cell, a voltage of the sensing node SO may be higher than a reference voltage Vref.

However, in a sensing node development phase, when a voltage of the bitline BL is increased by the influence of noise, a voltage of the sensing node SO may be reduced.

Since a large amount of time may be required for a bitline voltage, increased by influence of noise, to recover to its original state, a voltage of the sensing node SO may also be continuously reduced. When a sensing margin (S/M) of a memory cell is small, the voltage of the sensing node SO may become lower than the reference voltage Vref. Thus, an off cell may be read incorrectly as an on cell.

Referring to FIG. 11, as a power supply noise occurs, a noise may occur in a bitline current control signal BLSHF controlling an operation of the fourth transistor TR4. The noise may have a magnitude less than a magnitude of the bitline current control signal BLSHF. Thus, due to the influence of the noise occurring in the bitline current control signal BLSHF, a magnitude of a voltage of the bitline BL may be reduced.

In a selective precharge operation, an unselected bitline, adjacent to a selected bitline is precharged with a ground voltage, so an effective capacitance value of the selected bitline may be increased. Thus, a large amount of time may be required for a bitline voltage, increased by influence of noise, to recover to its original state.

In a sensing node development phase, depending on a current flowing in a memory cell, a voltage of the sensing node SO may be changed. The sensing node is developed, and then data of a memory cell may be detected. When the memory cell is an on cell, a voltage of the sensing node SO may be lower than a reference voltage Vref.

However, in a sensing node development phase, when a voltage of the bitline BL is reduced by the influence of noise, a voltage of the sensing node SO may be increased. Since a large amount of time may be required for a bitline voltage, reduced by influence of noise, to recover to its original state, a voltage of the sensing node SO may also be continuously increased. When a sensing margin (S/M) of a memory cell is small, the voltage of the sensing node SO may become higher than the reference voltage Vref. Thus, an on cell may be read incorrectly as an off cell.

Figure 12A:
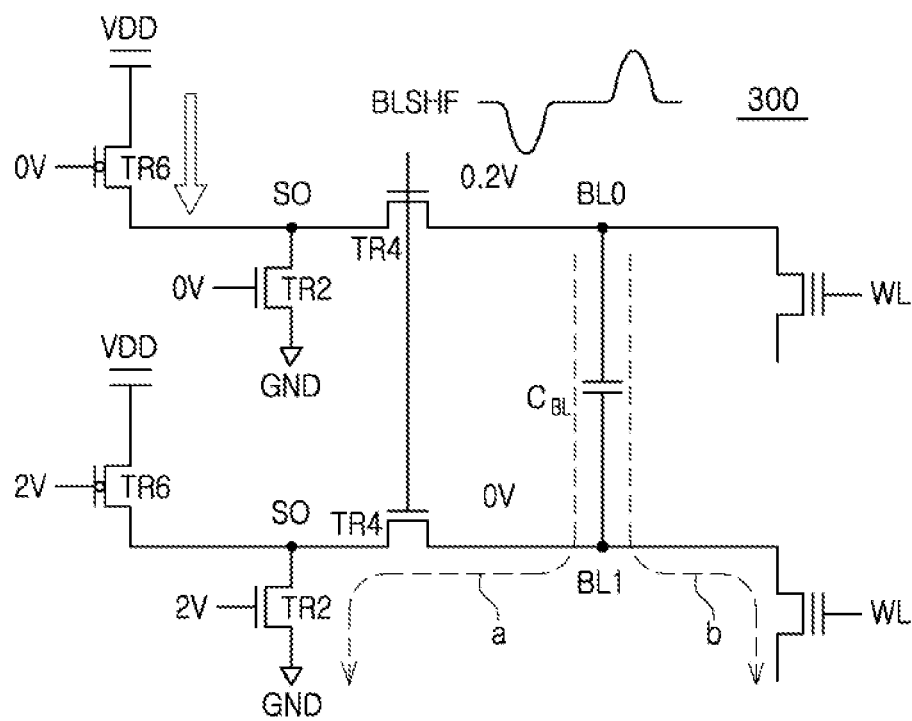
FIGS. 12A and 12B are hybrid voltage timing and circuit diagrams illustrating an operation of a memory device according to an exemplary embodiment of the present disclosure.
Figure 12B:
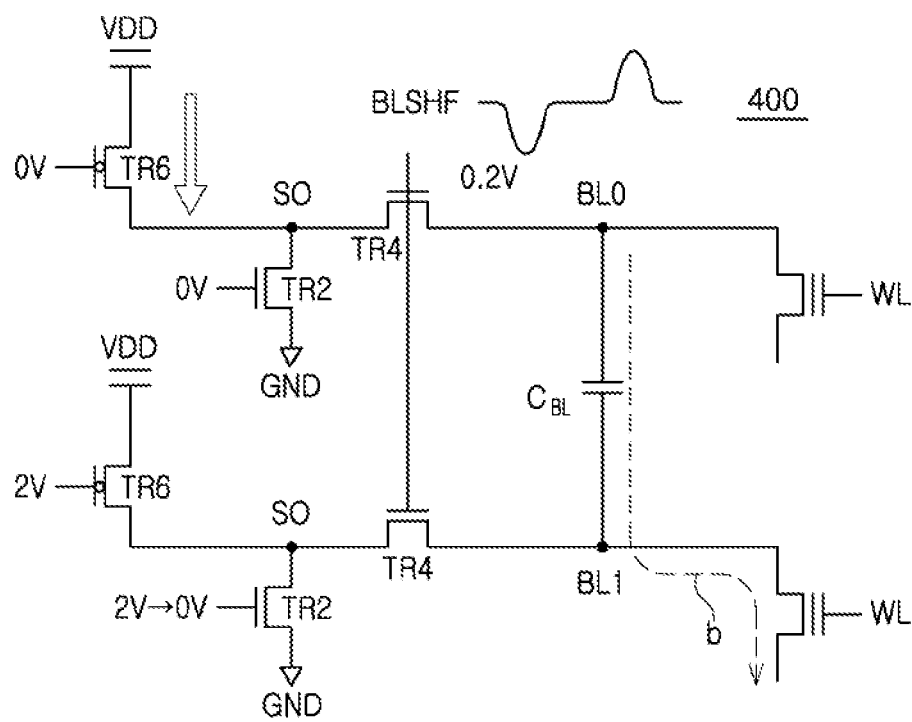

FIGS. 12A and 12B are hybrid voltage timing and circuit diagrams illustrating an operation of a memory device according to an exemplary embodiment of the present disclosure.

Referring to FIG. 12A, a memory device 300 according to a contrasting example may include a first page buffer and a second page buffer. The first page buffer may supply a first bias voltage to a selected bitline BL0 in a bitline precharge phase. The first bias voltage may have a magnitude greater than a ground voltage GND and less than a power supply voltage VDD. The first page buffer may include a second transistor TR2, a fourth transistor TR4, a sixth transistor TR6, and a sensing node SO.

The second transistor TR2 may be operated in response to a second bitline voltage control signal BLGND. The fourth transistor TR4 may be operated in response to a bitline current control signal BLSHF. The sixth transistor TR6 may be operated according to data stored in a data latch.

The second page buffer may supply a second bias voltage to an unselected bitline BL1 adjacent to a selected bitline BL0 in a bitline precharge phase. In the contrasting example, a second bias voltage may be a ground voltage GND. The second page buffer may include a second transistor TR2, a fourth transistor TR4, a sixth transistor TR6, and a sensing node SO.

The second transistor TR2 may be operated in response to a second bitline voltage control signal BLGND. The fourth transistor TR4 may be operated in response to a bitline current control signal BLSHF. The sixth transistor TR6 may be operated according to data (for example, '0' or '1') stored in a data latch.

A second transistor TR2, included in each of the first page buffer and the second page buffer, may be operated in response to a second bitline voltage control signal BLGND. The second bitline voltage control signal BLGND may be a signal commonly input to a first page buffer and a second page buffer. The second transistor TR2 may be turned-on during a reading operation in response to a second bitline voltage control signal BLGND.

In a selective precharge operation, an unselected bitline BL1 adjacent to a selected bitline BL0 may be precharged with a ground voltage GND. The selected bitline BL0 may be precharged with a voltage higher than a ground voltage GND and lower than a power supply voltage VDD. Thus, an effective capacitance value $C_{BL}$ of a selected bitline may be increased.

As an example, a second transistor TR2, included in each of the first page buffer and the second page buffer, may be turned-on during a reading operation in response to a second bitline voltage control signal (for example, 2V). Thus, between the selected bitline BL0 and the unselected bitline BL1, the first ground path a and the second ground path b may be provided.

During the reading operation, noise may occur in a bitline current control signal BLSHF. Due to the influence of the noise, a voltage of the selected bitline BL may be changed. When the effective capacitance value $C_{BL}$ of the selected bitline BL is increased, a large amount of time may be required for the changed voltage of the selected bitline to recover to its original state.

Referring to FIG. 12B, in an exemplary embodiment memory device 400 of FIG. 12B, in a manner different from the memory device 300 of FIG. 12A, a second transistor TR2 may be turned-off in response to a second bitline voltage control signal (for example, 0V) during a sensing node development phase.

Since the second transistor TR2 is turned-off, between the selected bitline BL0 and the unselected bitline BL1, a first ground path a may disappear, while a second ground path b may be only provided. Thus, an effective capacitance value $C_{BL}$ of the selected bitline may be reduced.

During the reading operation, noise may occur in a bitline current control signal BLSHF. Due to the influence of the noise, a voltage of the selected bitline BL may be changed. When the effective capacitance value $C_{BL}$ of the selected bitline BL is reduced, the time may be reduced for the changed voltage of the selected bitline to recover to its original state.

Figure 13:
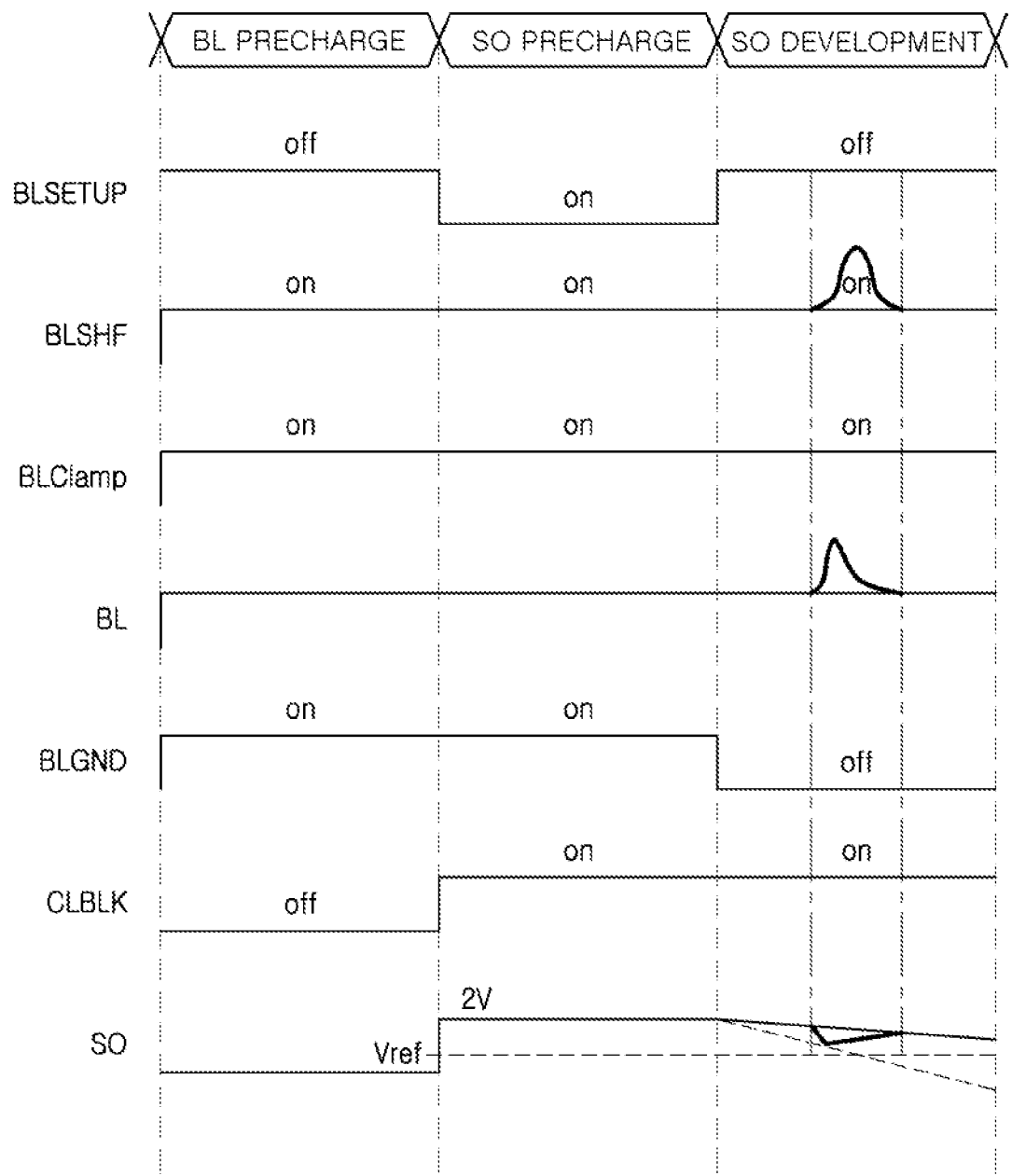
FIGS. 13 and 14 are voltage timing diagrams according to an exemplary embodiment of the present disclosure.
Figure 14:
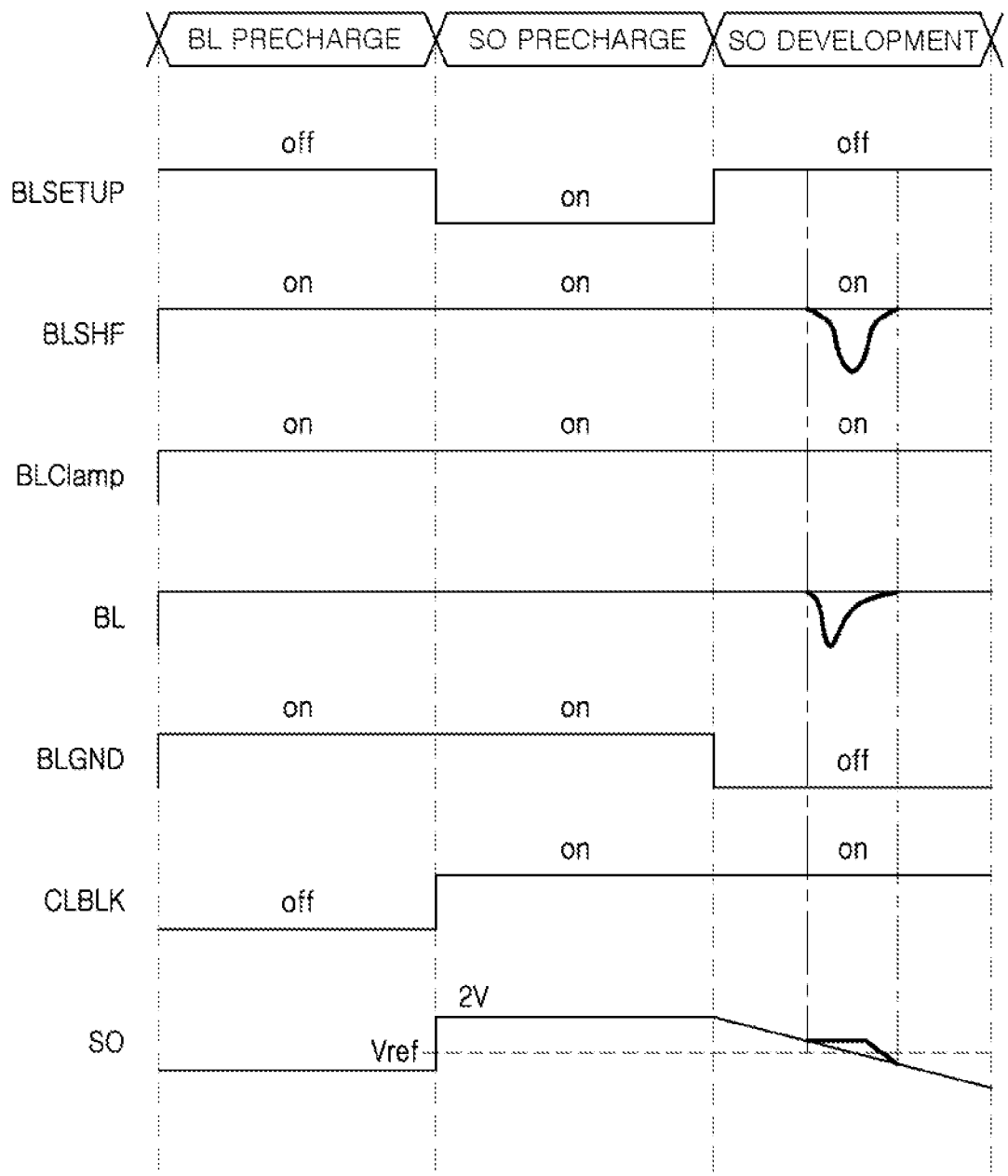

FIGS. 13 and 14 are voltage timing diagrams according to an exemplary embodiment of the present disclosure.

Referring to FIGS. 12B and 13, in a manner different from FIG. 10, during a sensing node development phase, the second transistor TR2 is turned-off in response to a second bitline voltage control signal BLGND.

In the sensing node development phase, a noise may occur in a bitline current control signal BLSHF controlling an operation of the fourth transistor TR4. The noise may have a magnitude greater than a magnitude of the bitline current control signal BLSHF. Thus, due to the influence of the noise occurring in the bitline current control signal BLSHF, a magnitude of a voltage of the bitline BL may also be increased. As the magnitude of a voltage of the bitline BL is increased, a voltage of the sensing node SO may be reduced.

During the sensing node development phase, the second transistor TR2 is turned-off in response to the second bitline voltage control signal BLGND, so an effective capacitance value $C_{BL}$ of the selected bitline BL may be reduced. When the effective capacitance value $C_{BL}$ of the selected bitline is reduced, the time may be reduced for the reduced voltage of the bitline BL to recover to its original state. Since the voltage of the bitline BL is recovered quickly, the voltage of the sensing node SO may be recovered quickly. Thus, even when a sensing margin of the memory cell is small, an off cell may be accurately read as an off cell.

Referring to FIGS. 12B and 14, in the sensing node development phase, a noise may occur in a bitline current control signal BLSHF controlling an operation of the fourth transistor TR4. The noise may have a magnitude less than a magnitude of the bitline current control signal BLSHF. Thus, due to the influence of the noise occurring in the bitline current control signal BLSHF, a magnitude of a voltage of the bitline BL may also be reduced. As the magnitude of a voltage of the bitline BL is reduced, a voltage of the sensing node SO may be increased.

During the sensing node development phase, the second transistor TR2 is turned-off in response to the second bitline voltage control signal BLGND, so an effective capacitance value $C_{BL}$ of the selected bitline BL may be reduced. When the effective capacitance value $C_{BL}$ of the selected bitline is reduced, the time required for the increased voltage of the bitline BL to recover to its original state may be reduced. Since the voltage of the bitline BL is recovered quickly, the voltage of the sensing node SO may be recovered quickly. Thus, even when a sensing margin of the memory cell is small, an on cell may be accurately read as an on cell.

Figure 15:
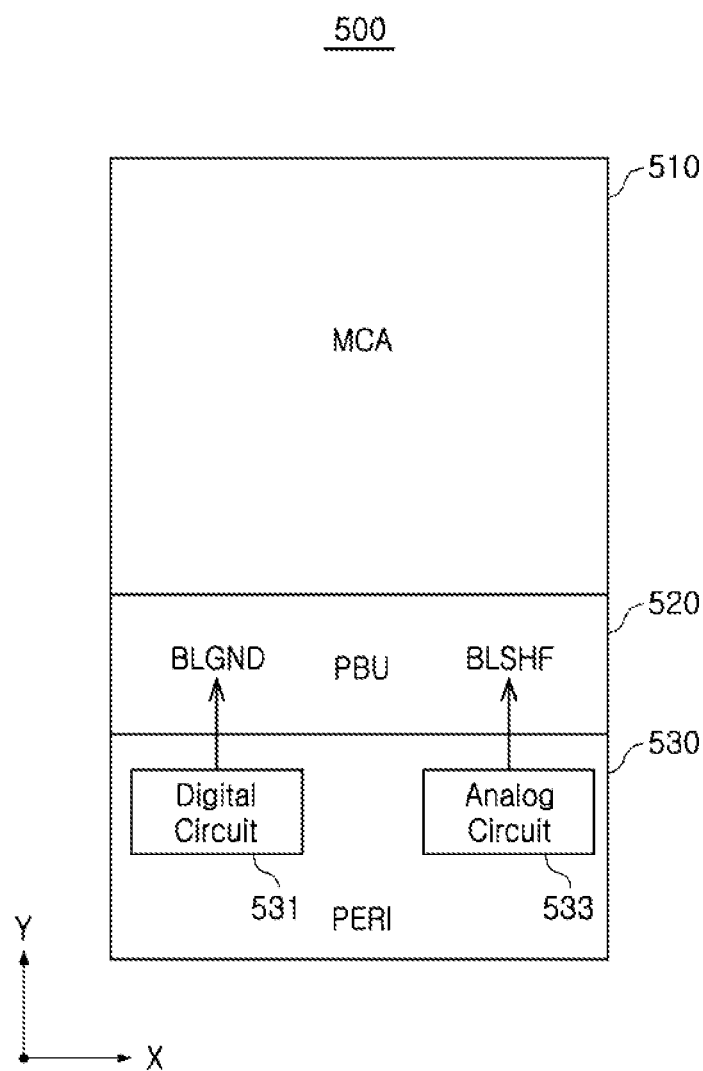
FIG. 15 is a schematic block diagram illustrating an operation of a memory device according to an exemplary embodiment of the present disclosure.

FIG. 15 is a schematic block diagram illustrating an operation of a memory device according to an exemplary embodiment of the present disclosure. Referring to FIG. 15, a memory device 500 according to an exemplary embodiment of the present disclosure may include a memory cell array region 510, a page buffer region 520, and a peripheral circuit region 530. In the memory cell array region 510, a plurality of memory cells stacked vertically on a substrate may be disposed. For example, the memory cell array 20 of FIG. 1 may be disposed in the memory cell array region 510.

The page buffer region 520 may be adjacent to the memory cell array region 510 in a first direction such as, for example, the Y direction, and a plurality of page buffers may be disposed therein. For example, the page buffer circuit 33 of FIG. 1 may be disposed in the page buffer region 520.

The peripheral circuit region 530 may include a digital circuit 531 and an analog circuit 533. As an example, the digital circuit 531 may generate a second bitline voltage control signal BLGND and output the second bitline voltage control signal to the page buffer region 520. The analog circuit 533 may generate a bitline current control signal BLSHF and output the bitline current control signal to the page buffer region 520.

According to an exemplary embodiment of the present disclosure, the digital circuit 531 may output the second bitline voltage control signal BLGND in synchronization with a clock signal. The memory device 500 may adjust the clock signal to adjust the timing at which a bitline voltage control element is turned-off.

The analog circuit 533 may adjust a rising slope and a falling slope of the second bitline voltage control signal BLGND. Thus, the memory device 500 may adjust a rising slope and a falling slope of the second bitline voltage control signal BLGND to adjust the timing at which a bitline voltage control element is turned-off.

Figure 16:
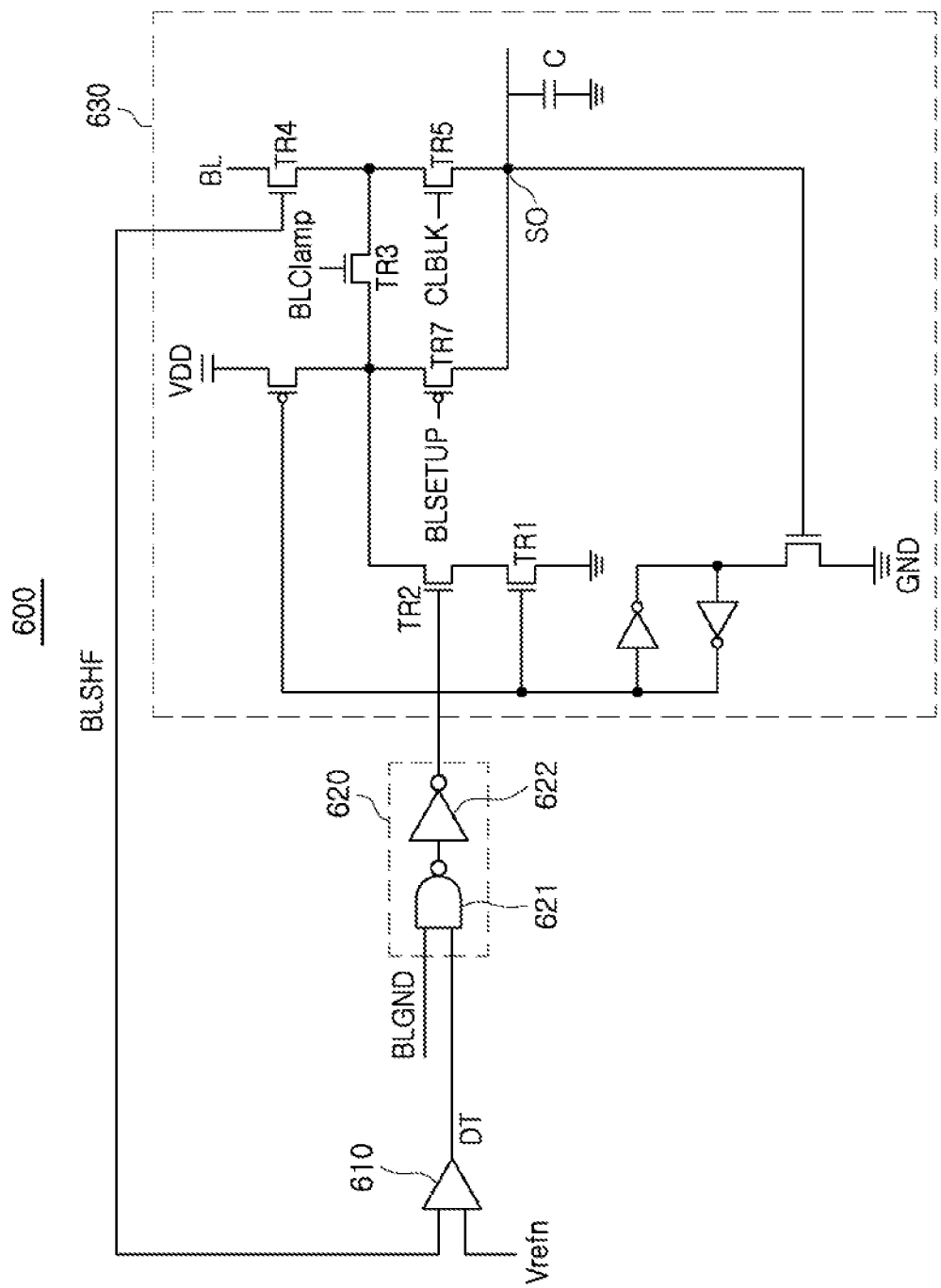
FIG. 16 is a circuit diagram illustrating an operation of a memory device according to an exemplary embodiment of the present disclosure.
Figure 17:
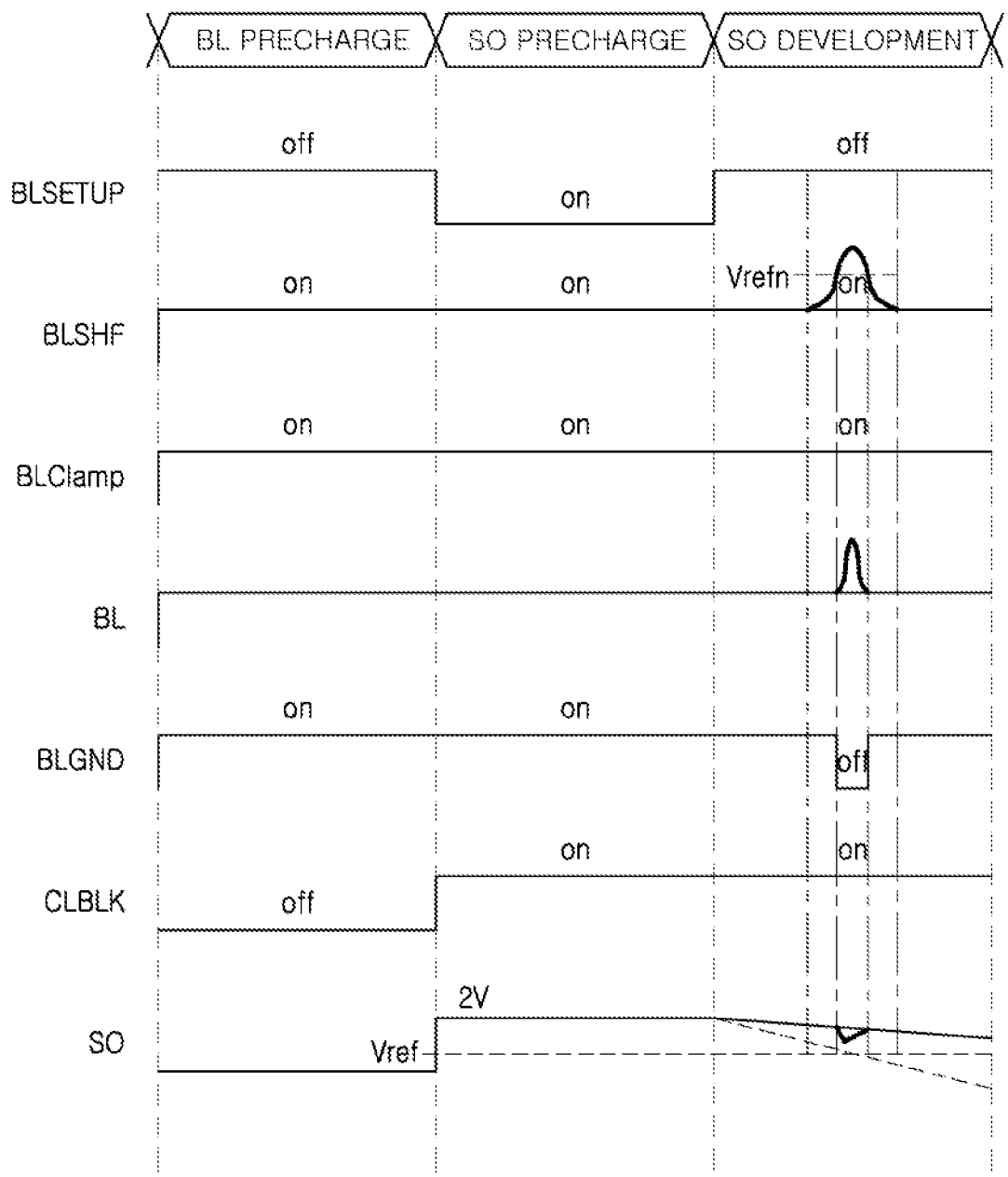
FIG. 17 is a voltage timing diagram according to an exemplary embodiment of the present disclosure.
Figure 18:
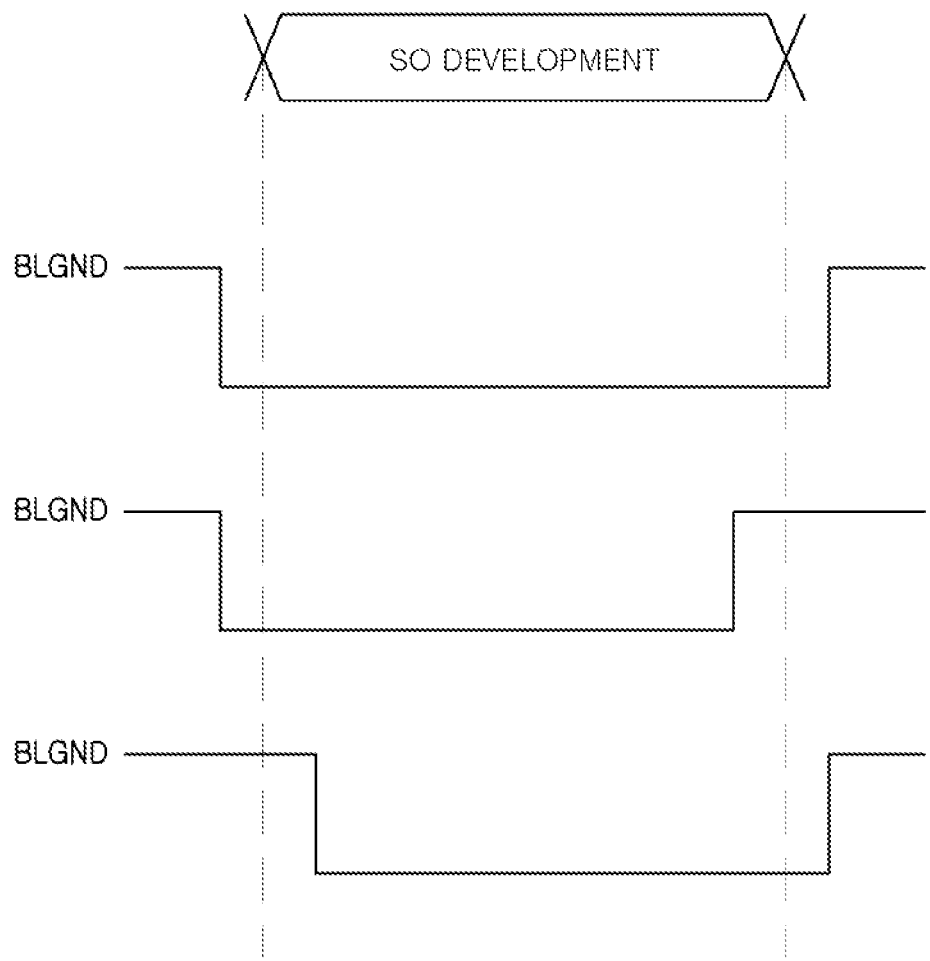
FIGS. 18A, 18B, 18C and 19 are voltage timing diagrams according to an exemplary embodiment of the present disclosure.

FIG. 16 is a circuit diagram illustrating an operation of a memory device according to an exemplary embodiment of the present disclosure, and FIG. 17 is a voltage timing diagram according to an exemplary embodiment of the present disclosure.

Referring to FIG. 16, a memory device 600 according to an exemplary embodiment of the present disclosure may include a noise detector 610, a logical operator 620, and a page buffer 630. The logical operator 620 may be a AND gate or its logical equivalent.

The noise detector 610 may include a first input terminal and a second input terminal. The first input terminal may receive a bitline current control signal BLSHF to be input to the page buffer 630. The second input terminal may receive a reference voltage Vrefn.

Referring to FIGS. 16 and 17 together, as power supply or like noise occurs in the memory device 600, a corresponding noise may occur in a current control signal BLSHF. The noise may have a magnitude greater than a magnitude of the bitline current control signal BLSHF. The noise detector 610 may compare the bitline current control signal BLSHF with a reference voltage Vrefn. The noise detector 610 may know a point in time at which a bitline current control signal BLSHF is greater than a reference voltage Vrefn based on the result of the comparison. During a phase in which the current control signal BLSHF is greater than the reference voltage Vrefn, a voltage of the bitline BL may be changed according to a noise of the current control signal BLSHF.

The logical operator 620 may receive the output of the noise detector 610 and the second bitline voltage control signal BLGND. The output of the logical operator 620 may be input to a gate of the second transistor TR2 of the page buffer 630. Thus, a turned-off state of second transistor TR2 may be maintained during a phase in which the bitline current control signal BLSHF is greater than the reference voltage Vrefn due to noise.

In a similar manner, as power supply noise occurs in the memory device 600, a corresponding noise may occur in a current control signal BLSHF. The noise may have a magnitude less than a magnitude of the bitline current control signal BLSHF. The noise detector 610 may compare the bitline current control signal BLSHF with a reference voltage Vrefn. The noise detector 610 may know a point in time at which a bitline current control signal BLSHF is less than a reference voltage Vrefn based on the result of the comparison. During a phase in which the current control signal BLSHF is less than the reference voltage Vrefn, a voltage of the bitline BL may be changed according to a noise of the current control signal BLSHF.

The logical operator 620 may receive the output of the noise detector 610 and the second bitline voltage control signal BLGND. The output of the logical operator 620 may be input to a gate of the second transistor TR2 of the page buffer 630. Thus, a turned-off state of the second transistor TR2 may be maintained during a phase in which the bitline current control signal BLSHF is less than the reference voltage Vrefn.

FIGS. 18A, 18B, 18C and 19 are voltage timing diagrams according to an exemplary embodiment of the present disclosure. According to an exemplary embodiment, a memory device may adjust a point in time at which a second bitline voltage control signal BLGND is turned-off according to a state of a sensing node.

As illustrated in FIG. 18A, before a sensing node development phase begins, a second bitline voltage control signal BLGND is turned-off. In addition, after the sensing node development phase ends, the second bitline voltage control signal BLGND is turned-on.

As illustrated in FIG. 18B, before the sensing node development phase begins, the second bitline voltage control signal BLGND is turned-off. In addition, before the sensing node development phase ends, the second bitline voltage control signal BLGND is turned-on.

As illustrated in FIG. 18C, after the sensing node development phase begins, the second bitline voltage control signal BLGND is turned-off. In addition, after the sensing node development phase ends, the second bitline voltage control signal BLGND is turned-on.

Figure 19:
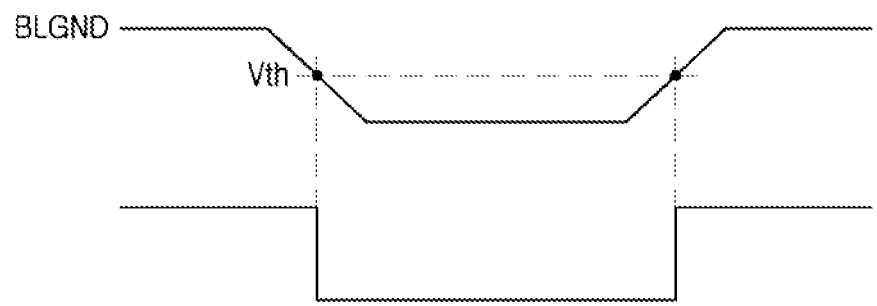

As illustrated in FIG. 19, a rising slope and a falling slope of the second bitline voltage control signal BLGND may be adjusted. The rising slope and the falling slope of the second bitline voltage control signal BLGND are adjusted, so a turn-on or turn-off operation of the second transistor TR2 may be adjusted. As an example, the second bitline voltage control signal BLGND and the threshold voltage Vth of the second transistor TR2 may be compared. When the second bitline voltage control signal BLGND is lower than the threshold voltage Vth of the second transistor TR2, the second transistor TR2 is turned-off. When the second bitline voltage control signal BLGND is higher than the threshold voltage Vth of the second transistor TR2, the second transistor TR2 is turned-on.

Figure 20:
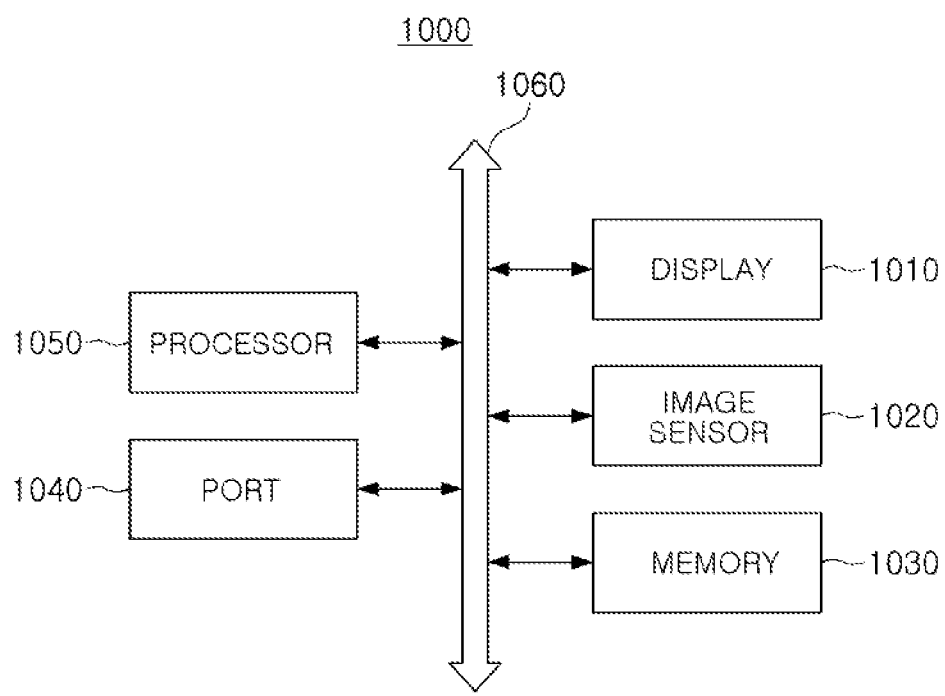
FIG. 20 is a schematic block diagram illustrating an electronic device including a memory device according to an exemplary embodiment of the present disclosure.

FIG. 20 is a schematic block diagram illustrating an electronic device including a memory device according to an exemplary embodiment of the present disclosure.

An electronic device 1000 according to an exemplary embodiment illustrated in FIG. 20 may include a display 1010 connected to a channel or bus 1060, an image sensor 1020 connected to the bus, a memory 1030 connected to the bus, a port 1040 connected to the bus, a processor 1050 connected to the bus, and the like. The electronic device 1000 may further include a wire/wireless communications device, a power supply, and the like. Among components illustrated in FIG. 20, the port 1040 may be provided for the electronic device 1000 to communicate with a video card, a sound card, a memory card, a universal serial bus (USB) device, and the like. The electronic device 1000 may be a concept including a smartphone, a tablet PC, a smart wearable device, and the like, as well as a desktop computer and a laptop computer according to the pertinent art.

The processor 1050 may perform a certain operation, a command, a task, and the like. The processor 1050 may be a central processing unit (CPU) or a microprocessor unit (MCU), and may communicate with the display 1010, the image sensor 1020, the memory 1030, and other devices connected to the port 1040 through the bus 1060.

The memory 1030 may be a storage medium storing data necessary for an operation of the electronic device 1000, or storing multimedia data or the like. The memory 1030 may include a volatile memory such as a random-access memory (RAM) or a non-volatile memory such as a flash memory. In addition, the memory 1030 may include at least one of a solid-state drive (SSD), a hard disk drive (HDD), and an optical disk drive (ODD), as a storage device. The memory 1030 may include one or more memory devices in accordance with those previously described with reference to FIGS. 1 through 19.

As set forth above, according to exemplary embodiments of the present disclosure, an unselected bitline, which may have been precharged with a ground voltage according to the related art, may be floated during a sensing node development phase. Thus, even when noise is encountered, the performance of an exemplary embodiment memory device may be improved.

While exemplary embodiments have been shown and described above, it will be apparent to those of ordinary skill in the pertinent art that modifications and variations may be made without departing from the scope or spirit of the present disclosure, as defined by the appended claims.

What is claimed is:

1. A memory device, comprising:
a first page buffer supplying a first bias voltage to a selected bitline in a bitline precharge phase; and
a second page buffer supplying a second bias voltage to an unselected bitline, adjacent to the selected bitline, in the bitline precharge phase,
wherein the first page buffer includes a first bitline precharge circuit supplying the first bias voltage to the selected bitline, the second page buffer includes a second bitline precharge circuit supplying the second bias voltage to the unselected bitline,
wherein the second page buffer floats the unselected bitline in a sensing phase for detecting data of a selected memory cell connected to the selected bitline.

2. The memory device of claim 1, wherein:
the second page buffer includes a bitline voltage control element for controlling the unselected bitline to be precharged with the second bias voltage, and
the bitline voltage control element is turned-on in the bitline precharge phase, and turned-off in the sensing phase.

3. The memory device of claim 2, wherein:
the first page buffer includes a bitline current control element to controlling a current flowing into the selected bitline such that the selected bitline is precharged with a voltage lower than the first bias voltage, and
the memory device controls the bitline voltage control element using a control signal controlling the bitline current control element.

4. The memory device of claim 3, wherein:
the memory device receives a control signal for controlling the bitline current control element in the sensing phase, and comparing the control signal with a reference signal,
the bitline voltage control element is turned-off during a time period in which the control signal is smaller than the reference signal,
the control signal includes a noise, and
a voltage of the selected bitline is changed according to the noise during a time period in which the control signal is smaller than the reference signal.

5. The memory device of claim 3, wherein:
the memory device receives a control signal for controlling the bitline current control element in the sensing phase, and comparing the control signal with a reference signal,
the bitline voltage control element is turned-off during a time period in which the control signal is greater than the reference signal,
the control signal includes a noise, and
a voltage of the selected bitline is changed according to the noise during a time period in which the control signal is greater than the reference signal.

6. The memory device of claim 2, wherein:
a control signal for controlling the bitline voltage control element is output in synchronization with a clock signal, and
timing at which the bitline voltage control element is turned-off is controlled in response to the clock signal.

7. The memory device of claim 2, wherein a rising slope and a falling slope of a control signal for controlling the bitline voltage control element are controlled to control timing at which the bitline voltage control element is turned-off.

8. The memory device of claim 1, wherein a capacitance value between the selected bitline and the unselected bitline is controlled in the sensing phase.

9. A page buffer, supplying a bitline voltage to a bitline connected to a plurality of memory cells, the page buffer comprising:
a data latch storing information on whether a selected memory cell is provided among the plurality of memory cells; and
a bitline precharge circuit, controlled by the data latch, and having a first bitline precharge control element connected between the bitline and a first power node for outputting a first bitline voltage, a second bitline precharge control element connected to a second power node for outputting a second bitline voltage lower than the first bitline voltage, and a first bitline voltage control element connected between the first bitline precharge control element and the second bitline precharge control element,
wherein the first bitline voltage control element is turned-off during a sensing node development phase when the bitline is an unselected bitline.

10. The page buffer of claim 9, wherein the bitline precharge circuit further includes a bitline current control element controlling a current flowing into the bitline such that the bitline is precharged with a first bias voltage higher than a ground voltage and lower than a power supply voltage.

11. The page buffer of claim 10, further comprising:
a sensing control element controlling connection between a sensing node and the bitline in a sensing phase for detecting data of a memory cell connected to the bitline.

12. The page buffer of claim 11, wherein the page buffer further includes a second bitline voltage control element between the first bitline precharge control element and the bitline current control element, and
the second bitline voltage control element maintains a voltage between the bitline current control element and the sensing control element lower than a voltage of the sensing node in the sensing phase.

13. The page buffer of claim 11, wherein the sensing control element is turned-on in a sensing node precharge phase, and maintains a turned-on state in the sensing phase.

14. The page buffer of claim 10, wherein the bitline current control element is turned-on in a bitline precharge phase, is turned-off in a sensing node precharge phase, and is turned-on in a sensing node development phase.

15. A memory device, comprising:
a memory controller providing a first phase for bitline precharge, a second phase for sensing node precharge following the bitline precharge, and a third phase for sensing node development following the sensing node precharge;
a plurality of memory cells arranged in a stacked three-dimensional matrix of adjacent strings; and
at least one page buffer connected to the memory controller and the plurality of memory cells, the at least one page buffer including first and second non-grounded bitline bias voltage outputs concurrently connectable to adjacent strings, the at least one page buffer comprising a first page buffer bitline precharge circuit connected to a selected bitline with a first bias voltage during the first phase, and a second page buffer bitline precharge circuit connected to an unselected bitline, adjacent to the selected bitline, with a second bias voltage lower than the first bias voltage during the first phase,
wherein, during the second phase after the first phase, the first page buffer bitline precharge circuit precharges a sensing node connected to the selected bitline with a third bias voltage higher than the first bias voltage,
wherein during the third phase, the second page buffer bitline precharge circuit floats the unselected bitline while detecting data of a selected memory cell connected to the selected bitline,
wherein the first page buffer bitline precharge circuit includes a bitline current control element controlling a current flowing into the selected bitline such that the selected bitline is precharged with the first bias voltage,
wherein the memory device compares a control signal for controlling the bitline current control element with a reference signal during the third phase, and floats the unselected bitline during a time period in which the control signal is greater than the reference signal.

16. The memory device of claim 15, wherein the control signal includes noise, and a voltage of the selected bitline is changed according to the noise during a time period in which the control signal is greater than the reference signal.

17. The memory device of claim 15, wherein:
the at least one page buffer includes a bitline voltage control element controlling supply of the second bias voltage to the unselected bitline,
a turned-off state of the bitline voltage control element is maintained, during at least a portion of the third phase,
during the second phase, the bitline voltage control element is turned-off, and after the third phase ends, the bitline voltage control element is turned-one.

18. The memory device of claim 15, wherein:
during the second phase, the bitline voltage control element is turned-off, and
before the third hate ends, the bitline voltage control element is turned-on.

19. The memory device of claim 15, wherein:
after the third phase begins, the bitline voltage control element is turned-off, and
after the third phase ends, the bitline voltage control element is turned on.

20. The memory device of claim 15, further comprising:
a sensing node circuit connected to each of the first page buffer bitline precharge circuit and the second page buffer bitline precharge circuit, respectively;
a data latch circuit connected to each of the first page buffer bitline precharge circuit and the second page buffer bitline precharge circuit, respectively;
a digital circuit with a bitline ground output connected to the at least one page buffer; and
an analog circuit with a bitline current control signal output connected to the at least one page buffer.

* * * * *